(12) United States Patent
Mihara

(10) Patent No.: US 10,325,921 B2
(45) Date of Patent: Jun. 18, 2019

(54) SEMICONDUCTOR DEVICE AND MANUFACTURING METHOD OF THE SAME

(71) Applicant: Renesas Electronics Corporation, Tokyo (JP)

(72) Inventor: Tatsuyoshi Mihara, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/189,373

(22) Filed: Nov. 13, 2018

(65) Prior Publication Data

US 2019/0103413 A1    Apr. 4, 2019

Related U.S. Application Data

(62) Division of application No. 15/582,911, filed on May 1, 2017, now Pat. No. 10,163,921.

(30) Foreign Application Priority Data

Jun. 3, 2016   (JP) ................... 2016-111505

(51) Int. Cl.
| | |
|---|---|
| *H01L 21/28* | (2006.01) |
| *H01L 29/78* | (2006.01) |
| *H01L 29/423* | (2006.01) |
| *H01L 29/792* | (2006.01) |
| *H01L 27/11568* | (2017.01) |

(Continued)

(52) U.S. Cl.
CPC .. *H01L 27/11568* (2013.01); *H01L 21/28273* (2013.01); *H01L 21/28282* (2013.01);
(Continued)

(58) Field of Classification Search
CPC ......... H01L 21/28273; H01L 21/28282; H01L 21/84; H01L 27/115; H01L 27/11521;
(Continued)

(56) References Cited

U.S. PATENT DOCUMENTS

| | | |
|---|---|---|
| 6,459,121 B1 | 10/2002 | Sakamoto et al. |
| 6,657,248 B1 | 12/2003 | Matsuzaki et al. |

(Continued)

FOREIGN PATENT DOCUMENTS

JP    2006-41354 A    2/2006

*Primary Examiner* — Mary A Wilczewski
*Assistant Examiner* — Tsz K Chiu
(74) *Attorney, Agent, or Firm* — McDermott Will & Emery LLP

(57) ABSTRACT

To improve reliability of a semiconductor device, a control transistor and a memory transistor formed in a memory cell region are configured to have a double-gate structure, and a transistor formed in a peripheral circuit region is configured to have a triple-gate structure. For example, in the memory transistor, a gate insulating film formed by an ONO film is provided between a memory gate electrode and sidewalls of a fin, and an insulating film (a stacked film of a multilayer film of an insulating film/an oxide film and the ONO film) thicker than the ONO film is provided between the memory gate electrode and a top surface of the fin. This configuration can reduce concentration of an electric field onto a tip of the fin, so that deterioration of reliability of the ONO film can be prevented.

6 Claims, 35 Drawing Sheets

(51) Int. Cl.
*H01L 27/11573* (2017.01)
*H01L 27/11575* (2017.01)

(52) U.S. Cl.
CPC .. *H01L 27/11573* (2013.01); *H01L 27/11575* (2013.01); *H01L 29/42344* (2013.01); *H01L 29/42368* (2013.01); *H01L 29/7855* (2013.01); *H01L 29/792* (2013.01); *H01L 29/7851* (2013.01)

(58) Field of Classification Search
CPC ........... H01L 27/11568; H01L 27/1203; H01L 29/66825; H01L 29/66833; H01L 29/792; H01L 21/2815; G11C 16/0433
See application file for complete search history.

(56) References Cited

U.S. PATENT DOCUMENTS

| | | | |
|---|---|---|---|
| 7,245,531 B2 | 7/2007 | Okazaki et al. | |
| 7,504,689 B2 | 3/2009 | Hisamoto et al. | |
| 7,709,881 B2 | 5/2010 | Toshiba | |
| 7,745,288 B2 | 6/2010 | Toba et al. | |
| 8,530,958 B2 | 9/2013 | Toba et al. | |
| 8,822,289 B2 | 9/2014 | Fang et al. | |
| 9,257,446 B2 | 2/2016 | Arigane et al. | |
| 9,293,604 B2 | 3/2016 | Owada | |
| 9,443,991 B2 | 9/2016 | Funuyama et al. | |
| 9,741,869 B1 | 8/2017 | Mihara | |
| 9,831,092 B2 * | 11/2017 | Mihara | H01L 29/42344 |
| 2005/0056888 A1 | 3/2005 | Youn et al. | |
| 2007/0058441 A1 * | 3/2007 | Oka | G11C 16/0433 |
| | | | 365/185.28 |
| 2007/0164342 A1 | 7/2007 | Okazaki et al. | |
| 2010/0078705 A1 | 4/2010 | Chakihara et al. | |
| 2010/0200909 A1 | 8/2010 | Kawashima et al. | |
| 2011/0095348 A1 | 4/2011 | Chakihara et al. | |
| 2011/0272753 A1 * | 11/2011 | Funayama | H01L 27/11565 |
| | | | 257/299 |
| 2014/0239378 A1 * | 8/2014 | Toba | H01L 29/792 |
| | | | 257/324 |
| 2016/0293719 A1 | 10/2016 | Mihara | |

* cited by examiner

FIG. 24
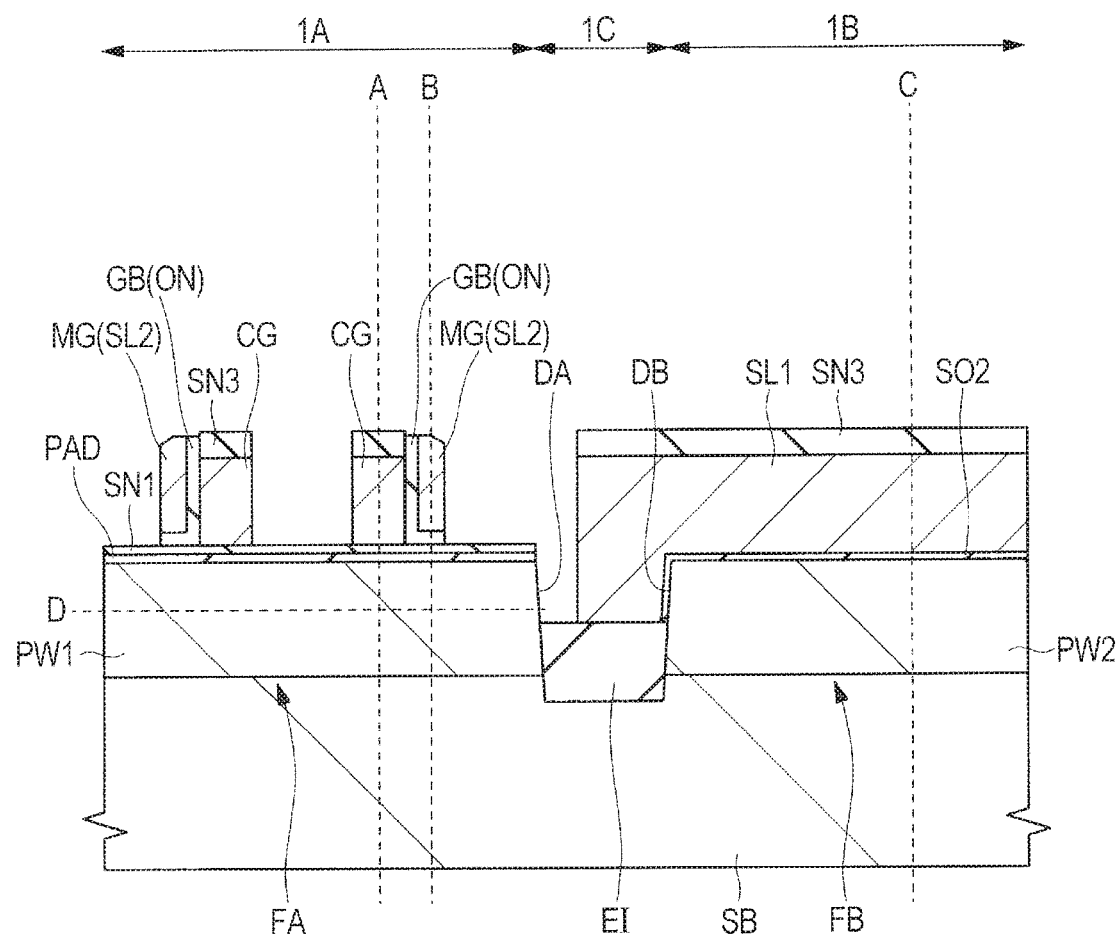

SEMICONDUCTOR DEVICE AND MANUFACTURING METHOD OF THE SAME

CROSS-REFERENCE TO RELATED APPLICATIONS

This application is a Divisional of U.S. patent application Ser. No. 15/582,911, filed on May 1, 2017, which claims priority from Japanese Patent Application No. 2016-111505 filed on Jun. 3, 2016, the contents of all of which are incorporated herein by reference in its entirety.

BACKGROUND

The present invention relates to a semiconductor device and a manufacturing method of the same, and can be suitably used for a semiconductor device that includes a fin field effect transistor having a fin-shaped semiconductor portion, for example, and a manufacturing method of the same.

Japanese Unexamined Patent Application Publication No. 2006-41354 describes a memory cell in a non-volatile semiconductor memory device having a split-gate structure, which has a memory gate formed on a convex substrate and uses a side surface of the memory gate as a channel.

A fin field effect transistor (FINFET) has a structure in which a fin-shaped semiconductor portion is formed and a gate electrode is formed to cross over this fin-shaped semiconductor portion, so that an effective channel width can be made larger and a high current driving capability can be obtained even in a scaled layout. However, in a case of using an ONO (Oxide Nitride Oxide) film as a charge storage film, there is a concern of concentration of an electric field onto a tip portion of the fin-shaped semiconductor portion. This concentration of the electric field may deteriorate reliability of the ONO film.

Other problems and novel features will be apparent from the description of this specification and the accompanying drawings.

SUMMARY

A semiconductor device according an embodiment has a configuration in which a control transistor and a memory transistor both formed in a memory cell region have a double-gate structure, and a transistor formed in a peripheral circuit region has a triple-gate structure. That is, in the control transistor, a gate insulating film is formed between a control gate electrode and sidewalls of a fin, and a multilayer film of an oxide film and a nitride film, which is thicker than the gate insulating film, is formed between the control gate electrode and a top surface of the fin. Similarly, in the memory transistor, a gate insulating film is formed by an ONO film between a memory gate electrode and the sidewalls of the fin, and a stacked film of the above multilayer film and the ONO film, which is thicker than the ONO film, is formed between the memory gate electrode and the top surface of the fin.

A manufacturing method of a semiconductor device according to an embodiment forms a plurality of fins in a memory cell region and a peripheral circuit region, respectively, first. At this time, a multilayer film in which an oxide film and a nitride film are sequentially formed is provided only on a top surface of the fin in the memory cell. Then, an oxide film is formed on sidewalls of the fin in a control transistor region in the memory cell region, and thereafter a control gate electrode of a control transistor is formed to cross over the fin. Further, an ONO film covering the above multilayer film on the top surface of the fin and the sidewalls is formed in a memory transistor region in the memory cell region, and thereafter a memory gate electrode of a memory transistor is formed to cross over the fin. Meanwhile, in the peripheral circuit region, an oxide film is formed on the top surface and the sidewalls of the fin, and thereafter a gate electrode of a transistor is formed to cross over the fin.

According to an embodiment, it is possible to improve reliability of a semiconductor device.

BRIEF DESCRIPTION OF THE DRAWINGS

FIG. 24 shows a cross-sectional view explaining a manufacturing step of the semiconductor device, subsequent to FIG. 22.

DETAILED DESCRIPTION

Figure 1:
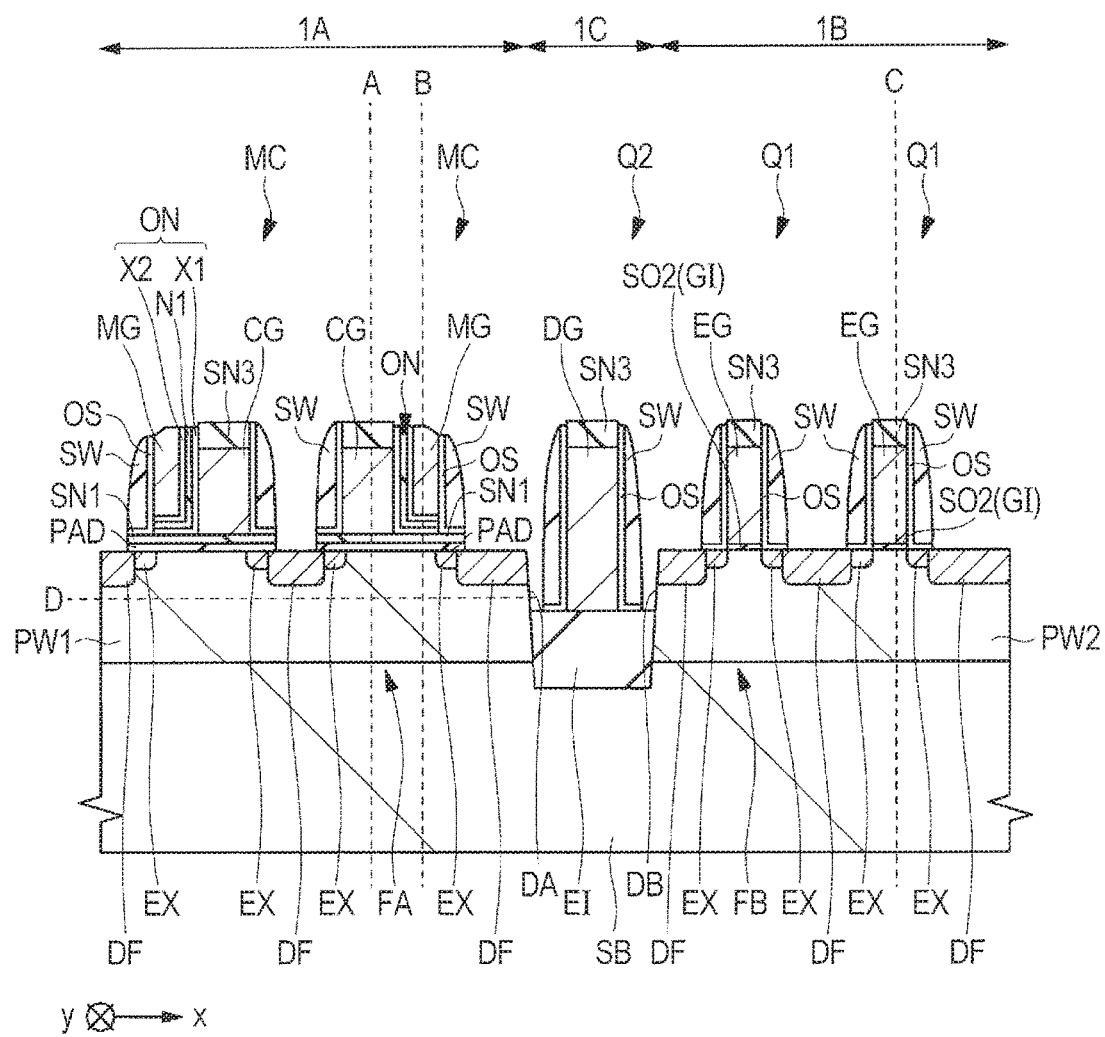
FIG. 1 shows a cross-sectional view of a main portion of a semiconductor device according to an embodiment.

The following embodiment will be described while being divided into a plurality of sections or embodiments, if necessary for the sake of convenience. However, unless otherwise specified, these are not independent of each other, but are in a relation such that one is a modified example, detailed description, complementary explanation, or the like of a portion or the whole of the other.

Further, in the following embodiment, when a reference is made to the number of elements and the like (including number, numerical value, quantity, range, and the like), the number of elements is not limited to the specific number, but may be equal to, greater than, or less than the specific number, unless otherwise specified, or except the case where the number is apparently limited to the specific number in principle, or except for other cases.

Furthermore, in the following embodiment, a constitutional element thereof (including an operation step or the like) is not always essential, unless otherwise specified, or except the case where it is apparently considered essential in principle, or except for other cases.

In addition, when the description such as "be formed of A", "be formed by A", "include(s) A", and "have/has A" is used, the description is not intended to exclude another element, unless otherwise it is clearly described that only that element is used or except for other cases. Similarly, in the following embodiment, when a reference is made to the shape, positional relationship or the like of the constitutional elements or the like, it is understood that it includes one substantially analogous or similar to the shape or the like, unless otherwise specified, or unless otherwise considered apparently in principle, or except for other cases. This also applies to the aforementioned numerical value and range.

Throughout the drawings for explaining the following embodiment, members having the same function are labeled with the same reference sign in principle, and the redundant description is omitted. In a cross-sectional view and a plan view, the size of each portion does not correspond to that in an actual device. A specific portion may be illustrated in a relatively large size for making the drawings easier to understand. Also in a case where the cross-sectional view and the plan view correspond to each other, a specific portion may be illustrated in a relatively large size for making the drawings easier to understand. Further, hatching may be omitted even in a cross-sectional view for making the drawings easier to understand, and hatching may be given even in a plan view for making the drawings easier to understand.

The present embodiment is described in detail below referring to the drawings.

Embodiment

<<Configuration of Semiconductor Device>>

Figure 2:
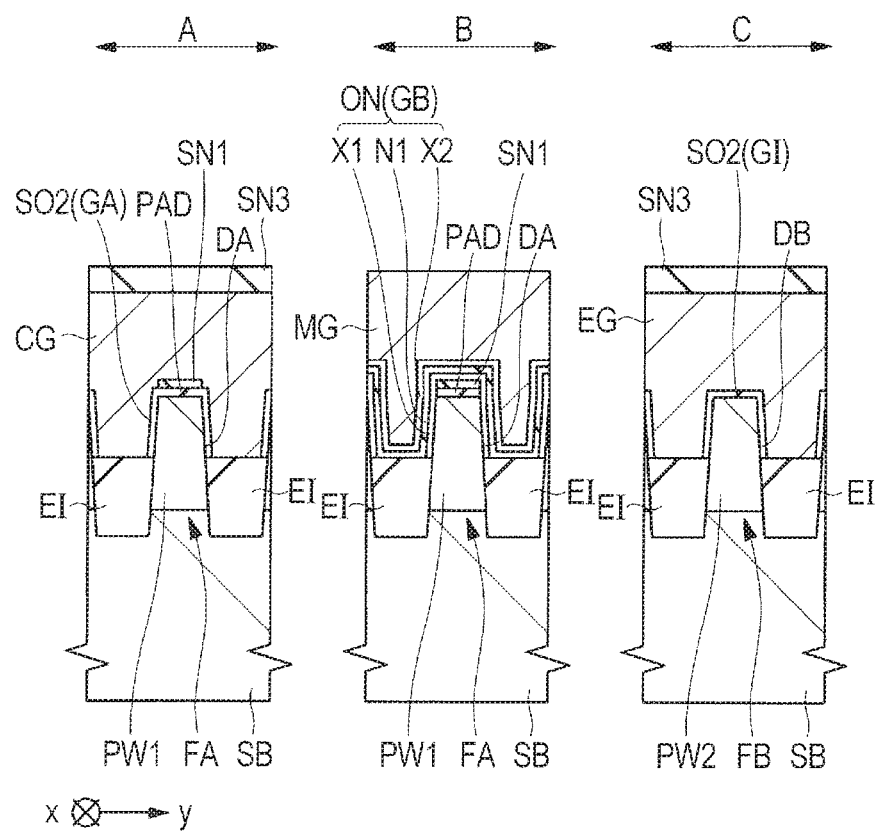
FIG. 2 shows cross-sectional views along line A, line B, and line C in FIG. 1.
Figure 3:
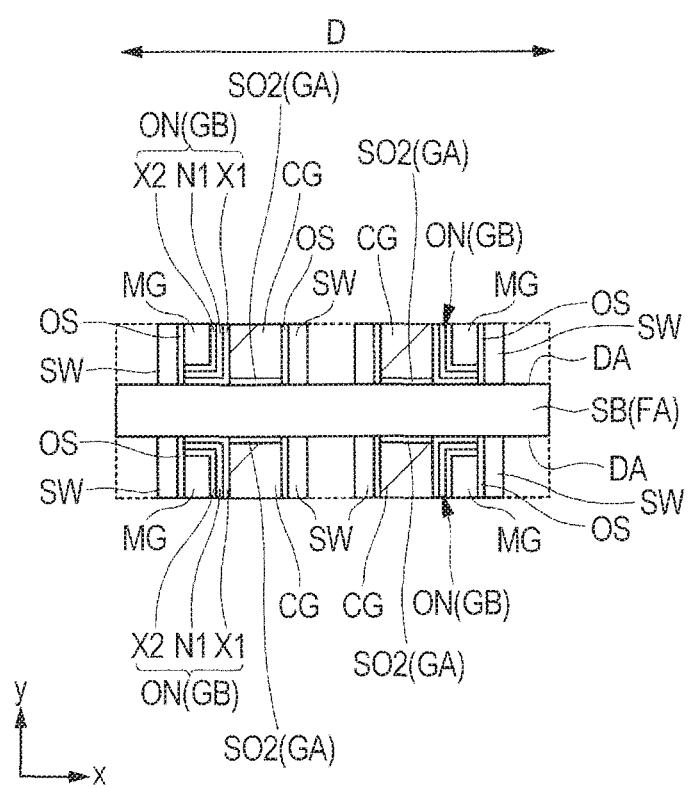
FIG. 3 shows a plan view along line D in FIG. 1.

A configuration of a semiconductor device according to the present embodiment is described referring to FIGS. 1 to 3. FIG. 1 shows a cross-sectional view of a main portion of the semiconductor device according to the present embodiment. FIG. 2 shows cross-sectional views along line A, line B, and line C in FIG. 1. FIG. 3 shows a plan view along line D in FIG. 1.

The semiconductor device according to the present embodiment includes a split-gate memory cell (a nonvolatile memory cell) MC formed by two FINFETs (a control transistor and a memory transistor), and a transistor Q1 that is an n-channel FINFET having a low breakdown voltage, for example, both of which are mounted on the same semiconductor chip. As illustrated in FIGS. 1 to 3, the memory cell MC is arranged in a memory cell region 1A and the low breakdown voltage transistor Q1 is arranged in a peripheral circuit region 1B. The memory cell region 1A and the peripheral circuit region 1B are regions arranged in a direction along a principal surface of a semiconductor substrate SB.

As illustrated in the memory cell region 1A in FIGS. 1 to 3, the memory cell MC is formed in an upper portion of a plate-like fin FA that is a portion of the semiconductor substrate SB and is formed in an upper portion of the semiconductor substrate SB. The low breakdown voltage transistor Q1 is formed in an upper portion of a plate-like fin FB that is a portion of the semiconductor substrate SB and is formed in an upper portion of the semiconductor substrate SB. Each of the fins FA and FB is a pattern of a semiconductor layer extending along x-direction along the principal surface of the semiconductor substrate SB. The width of each of the fins FA and FB in y-direction that is perpendicular to x-direction and is along the principal surface of the semiconductor substrate SB is significantly smaller than the width of each of the fins FA and FB in x-direction. The semiconductor substrate SB is formed of single-crystalline silicon, for example.

A plurality of fins FA are arranged in y-direction. This is the same for the fins FB. Further, although not illustrated, a plurality of fins FA may be arranged side by side also in x-direction in the memory cell region 1A, and may have any shape as long as each fin FA is a projection having a length, a width, and a height. For example, that shape can include a pattern meandering when seen in a plan view. Further, the arrangement of the fins FA is not specifically limited. This is the same for the arrangement of the fins FB in the peripheral circuit region 1B and the arrangement of the transistors Q1.

Grooves DA are formed in a top surface of the semiconductor substrate SB between the fins FA. Grooves DB are formed in the top surface of the semiconductor substrate SB between the fins FB.

A sidewall of the fin FA forms a sidewall of the groove DA. A sidewall of the fin FB forms a sidewall of the groove DB.

As illustrated in FIGS. 1 and 2, an element isolation region is STI (Shallow Trench Isolation) having the groove DA or DB the inside of which is embedded with an insulating film EI. However, the groove DA or DB is not completely embedded with the insulating film EI. A portion of each of the fins FA and FB is exposed above a top surface of the insulating film EI. The insulating film EI is formed by a silicon oxide film, for example.

That is, the fins FA and FB are semiconductor patterns projecting upward in the top surface of the semiconductor substrate SB, and are projections extending in x-direction in FIG. 1, for example. In top surfaces of the fins FA and FB, p-type wells PW1 and PW2 with a p-type impurity (e.g., boron (B)) introduced thereinto are respectively formed more deeply as compared with a source/drain region described later.

As illustrated in FIGS. 2 to 3, control gate electrodes CG of the control transistors (first transistors), extending in y-direction, and memory gate electrodes MG of the memory transistors (second transistors), extending in y-direction, are formed directly above the fins FA arranged in y-direction to cross over the fins FA. The control gate electrodes CG and the memory gate electrodes MG are formed by a polysilicon film, for example. The control gate electrodes CG are covered by an insulating film SN3. The insulating film SN3 is formed by a silicon nitride film, for example.

As illustrated in FIGS. 2 and 3, the control gate electrode CG is formed on the top surface of the fin FA via a multilayer film having a two-layer structure in which an oxide film PAD and an insulating film SN1 are sequentially formed (which may be referred to as the multilayer film of the insulating film SN1/the oxide film PAD), and is formed on the sidewalls of the fin FA via a gate insulating film GA formed by an oxide film SO2. That is, the multilayer film of the insulating film SN1/the oxide film PAD is formed on the top surface of the fin FA, and the gate insulating film GA formed by the oxide film SO2 is provided on the sidewalls of the fin FA above the top surface of the insulating film EI.

The oxide film PAD on the top surface of the fin FA is formed by a silicon oxide film, for example. The insulating film SN1 is formed by a silicon nitride film, for example, and has a thickness of about 5 nm to about 15 nm, for example. The oxide film SO2 on the sidewalls of the fin FA is formed by a silicon oxide film, for example, and has a thickness of about 5 nm to about 10 nm, for example.

The multilayer film of the insulating film SN1/the oxide film PAD does not function as the gate insulating film GA of the control transistor, because the thickness of the multilayer film of the insulating film SN1/the oxide film PAD is larger than the thickness of the oxide film SO2. Therefore, the control gate electrode CG has a double-gate structure that uses the oxide film SO2 formed on the sidewalls on both sides of the fin FA as the gate insulating film GA.

Further, because the multilayer film of the insulating film SN1/the oxide film PAD, that is larger in thickness than the oxide film SO2 is formed between the control gate electrode CG and the top surface of the fin FA, concentration of an electric field onto a tip portion of the fin FA can be alleviated.

As illustrated in FIGS. 1 and 3, one sidewall of the control gate electrode CG in x-direction is covered by an offset spacer OS and a sidewall SW, and the memory gate electrode MG is formed on the other sidewall via an ONO film ON.

The offset spacer OS is formed by a silicon oxide film, for example, and the sidewall SW is formed by a multilayer film having a three-layer structure in which a silicon oxide film, a silicon nitride film, and a silicon oxide film are sequentially formed, for example. The ONO film ON is a multilayer film in which a silicon oxide film (a bottom oxide film) X1, a silicon nitride film N1, and a silicon oxide film (a top oxide film) X2 are sequentially formed in that order from the semiconductor substrate SB side to the control gate electrode CG side. The silicon nitride film N1 is a trap insulating film (a charge storage film, a charge holding film). It is possible to change a threshold voltage of the memory cell MC by changing a charge storage state of the silicon nitride film N1 by an operation of the memory cell MC.

As illustrated in FIGS. 2 and 3, the memory gate electrode MC is formed on the top surface of the fin FA via the multilayer film of the insulating film SN1/the oxide film PAD and the ONO film ON, and on the sidewalls of the fin FA via a gate insulating film GB formed by the ONO film ON. That is, a stacked film in which the multilayer film of the insulating film SN1/the oxide film PAD and the ONO film ON are formed is provided on the top surface of the fin FA, and the gate insulating film GB formed by the ONO film ON is provided on the sidewalls of the fin FA above the top surface of the insulating film EI.

The ONO film ON has an L-shaped cross-section continuously formed along the top surface of the fin FA and a side surface of the control gate electrode CG. The memory gate electrode MG is insulated from the control gate electrode CG and the fin FA by the ONO film ON.

The stacked layer of the multilayer film of the insulating film SN1/the oxide film PAD and the ONO film ON does not function as the gate insulating film GB of the memory transistor, because the thickness of the stacked layer of the multilayer film of the insulating film SN1/the oxide film PAD is larger than the thickness of the multilayer film of the insulating film SN1/the oxide film PAD. Therefore, the memory gate electrode MG has a double-gate structure that uses the ONO film ON formed on the sidewalls on both sides of the fin FA as the gate insulating film GB.

Further, because the stacked film of the multilayer film of the insulating film SN1/the oxide film PAD and the ONO film ON is arranged between the memory gate electrode MG and the top surface of the fin FA, concentration of the electric field onto the tip portion of the fin FA can be alleviated.

As illustrated in FIGS. 1 and 3, a sidewall of the memory gate electrode NG in x-direction, which is not in contact with the ONO film ON, is covered by the offset spacer OS and the sidewall SW.

A silicide layer may be formed on a top surface of the control gate electrode CG, while the insulating film SN3 is removed. Also, a silicide layer may be formed on a top surface of the memory gate electrode MG. The silicide layer is formed of nickel silicide (NiSi) or cobalt silicide (CoSi), for example. By providing the silicide layer, it is possible to reduce a resistance of a contact between a contact plug (not illustrated) coupled to each of the top surface of the control gate electrode and the top surface of the memory gate electrode MG, and the control gate electrode CG or the memory gate electrode MG.

As illustrated in FIG. 1, directly above the fin FA in the memory cell region 1A, a pair of patterns each including the control gate electrode CG and the memory gate electrode MG adjacent to each other with the ONO film ON arranged therebetween is formed in such a manner that the patterns are arranged in x-direction. The patterns of the pair are spaced from each other. The memory gate electrodes MG are respectively adjacent to opposed surfaces of two control gate electrodes CG of the patterns forming the pair.

A pair of source/drain regions is formed in the top surface of the fin FA on both sides of the pattern in x-direction. Each of the source/drain regions includes two n-type semiconductor regions with an n-type impurity (for example, phosphorous (P) or arsenic (As)) introduced thereinto, that is, an extension region EX and a diffusion layer DF. The extension region EX is a region with a lower concentration of the n-type impurity than the diffusion layer DF. In this example, the diffusion layer DF is formed more deeply than the extension region EX. Also, the extension region EX is arranged at a position closer to the top surface of the fin FA directly below each of the control gate electrode CG and the memory gate electrode MG, than the adjacent diffusion layer DF. In this manner, the source/drain region has an LDD (Lightly Doped Drain) structure that includes the extension region EP with a lower impurity concentration and the diffusion layer DF with a higher impurity concentration.

The control gate electrode CG and a pair of source/drain regions formed in the top surface of the fin FA on both sides of the control gate electrodes CG include a control transistor having a MISFET (Metal Insulator Semiconductor Field Effect Transistor) structure. Also, the memory gate electrode MG and a pair of source/drain regions formed in the top surface of the fin FA on both sides of the memory gate electrodes MG include a memory transistor having the MISFET structure. One memory cell MC includes the control transistor and the memory transistor that share the source/drain regions with each other. That is, the memory cell MC includes the control gate electrode CG, the memory gate electrode MG, the ONO film ON, a drain region in the vicinity of the control gate electrode CG, and a source region in the vicinity of the memory gate electrode MG.

Two memory cells MC are formed on one fin FA. The two memory cells MC share the source region. The top surface of the fin FA directly below each of the control gate electrode CG and the memory gate electrode MG includes a channel region in which a channel is formed during an operation of the memory cell MC. This channel is a fin-type channel. The memory cell MC is an electrically rewritable non-volatile memory that allows a writing operation and an erasing operation therefor.

Further, in the peripheral circuit region 1B, a gate electrode EG extending in y-direction is formed directly above the fins FB arranged in y-direction to cross over those fins FB as illustrated in FIGS. 1 and 2. The gate electrode EG is arranged on the top surface and the sidewalls of the fin FB via a gate insulating film GI formed by the oxide film SO2. That is, the gate insulating film GI formed by the oxide film SO2 covers the top surface and the sidewalls of the fin FB that are exposed from the insulating film EI. Therefore, the gate electrode EG has a triple-gate structure that uses the oxide film SO2 formed on the top surface and the sidewalls on both sides of the fin FB as the gate insulating film GI.

The oxide film SO2 is formed by a silicon oxide film, for example, and the gate electrode EG is formed by a polycrystalline silicon film, for example.

As shown in FIGS. 1 and 2, the gate electrode EG is covered by the insulating film SN3, and each of side surfaces of the gate electrode EG on both sides in x-direction is covered by the offset spacer OS and the sidewall SW.

A silicide layer may be formed on a top surface of the gate electrode EG, while the insulating film SN3 is removed. By providing the silicide layer, a resistance of a contact between a contact plug (not illustrated) coupled to the top surface of the gate electrode EG and the gate electrode EG can be reduced.

Directly above the fin FB in the peripheral circuit region 1B is formed a pair of gate electrodes EG that are arranged in x-direction. The gate electrodes EG of the pair are spaced from each other.

A pair of source/drain regions is formed in the top surface of the fin FB on both sides of the gate electrode EG in x-direction. Each of the source/drain regions is formed by two n-type semiconductor regions with an n-type impurity (for example, phosphorus (P) or arsenic (As)) introduced thereinto, that is, the extension region EX and the diffusion layer DF, as with the source/drain regions in the memory cell region 1A. The source/drain regions in the memory cell region 1A are higher in impurity concentration than the source/drain regions in the peripheral circuit region 1B.

The gate electrode EG and the pair of source/drain regions formed in the top surface of the fin FB on both sides of the gate electrode EG include a low breakdown voltage transistor (a third transistor) Q1 having the MISFET structure.

Two transistors Q1 are formed on one fin FB. The top surface of the fin FB directly below the gate electrode EG includes a channel region in which a channel is formed during an operation of the transistor Q1. This channel is a fin-type channel. The two transistors Q1 share one of a pair of source/drain regions of each transistor Q1 with each other.

In the present embodiment, the control transistor and the memory transistor that are formed in an upper portion of the fin FA and the transistor Q1 formed in an upper portion of the fin FB, each having a portion of the fin FA or FB as the channel region, is called a FINFET. The control transistor and the memory transistor that include the memory cell MC are transistors driven at a higher voltage as compared with the low-breakdown voltage transistor Q1 including a peripheral circuit, and therefore are required to have a high breakdown voltage capability as compared with the transistor Q1.

Further, a boundary region 1C that is a boundary between the memory cell region 1A and the peripheral circuit region 1B is an element isolation region, in which a dummy transistor Q2 is formed on the insulating film EI as illustrated in FIG. 1. The dummy transistor Q2 includes a dummy gate electrode DG and the insulating film SN3 covering a top surface of the dummy gate electrode DG. Furthermore, each of side surfaces on both sides of the dummy gate electrode DG is covered by the offset spacer OS and the sidewall SW.

By forming the dummy gate electrode DG in the boundary region 1C, flatness of an interlayer insulating film, covering the memory cell region 1A and the peripheral circuit region 1B, can be improved.

The memory cell MC in the memory cell region 1A, the transistor Q1 in the peripheral circuit region 1B, and the dummy transistor Q2 in the boundary region 1C are covered by the interlayer insulating film, although not illustrated. The interlayer insulating film is formed by a silicon oxide film, for example. A thin insulating film is formed between the interlayer insulating film, and the memory cell MC, the transistor Q1, and the dummy transistor Q2, and is formed by a silicon nitride film, for example. A top surface of the interlayer insulating film is flattened in approximately the same plane.

A plurality of contact plugs extending through the interlayer insulating film are formed, and are electrically coupled to the control gate electrode CG, the memory gate electrode MG, the gate electrode EG, and each of the source/drain regions, for example. Further, wiring is formed on the contact plugs.

A main feature of the semiconductor device according to the present embodiment is in that the control transistor and the memory transistor formed in the memory cell region 1A have a double-gate structure, and the transistor Q1 formed in the peripheral circuit region 1B has a triple-gate structure, as described before.

In other words, in the control transistor, the gate insulating film GA formed by the oxide film SO2 is arranged between the control gate electrode CG and the sidewalls of the fin FA, and an insulating film (the multilayer film of the insulating film SN1/the oxide film PAD) thicker than the oxide film SO2 is arranged between the control gate electrode CG and the top surface of the fin FA. Due to this configuration, concentration of an electric field onto a tip portion of the fin FA can be alleviated. Similarly, in the memory transistor, the gate insulating film GB formed by the ONO film ON is arranged between the memory gate electrode MG and the sidewalls of the fin FA, and an insulating film (the stacked film of the multilayer film of the insulating film SN1/the oxide film PAD and the ONO film ON) thicker than the ONO film ON is arranged between the memory gate electrode MG and the top surface of the fin FA. Due to this configuration, concentration of the electric field onto the tip portion of the fin FA can be alleviated, so that deterioration of the reliability of the ONO film ON can be prevented.

Meanwhile, in the transistor Q1, the gate insulating film G1 formed by the oxide film SO2 is arranged between the gate electrode EG and the top surface and the sidewalls of the fin FB. Therefore, deterioration of driving characteristics of the transistor Q1 does not occur.

<<Manufacturing Method of Semiconductor Device>>

A manufacturing method of a semiconductor device according to the present embodiment is described in the order of steps, referring to FIGS. 4 to 33. FIGS. 4 to 33 show cross-sectional views and plan views that describe manufacturing steps of the semiconductor device according to the present embodiment. In FIGS. 4 to 33, 1A denotes a memory cell region, 1B denotes a peripheral circuit region, and 1C denotes a boundary region between the memory cell region and the peripheral circuit region. Although various semiconductor elements, such as a FINFET, a capacitor element, and a resistor element, are formed in the peripheral circuit region, only an n-channel FINFET is illustrated in this example.

Figure 4:
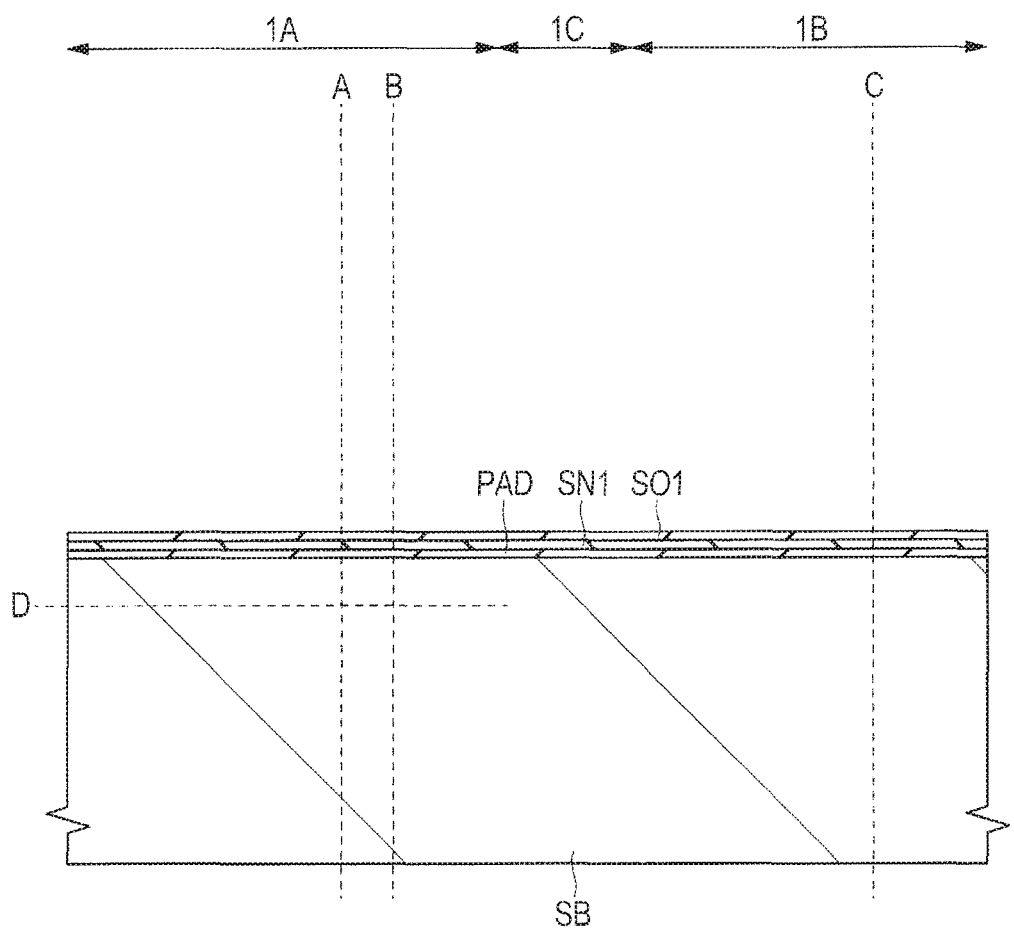
FIG. 4 shows a cross-sectional view explaining a manufacturing step of the semiconductor device according to the embodiment.
Figure 5:
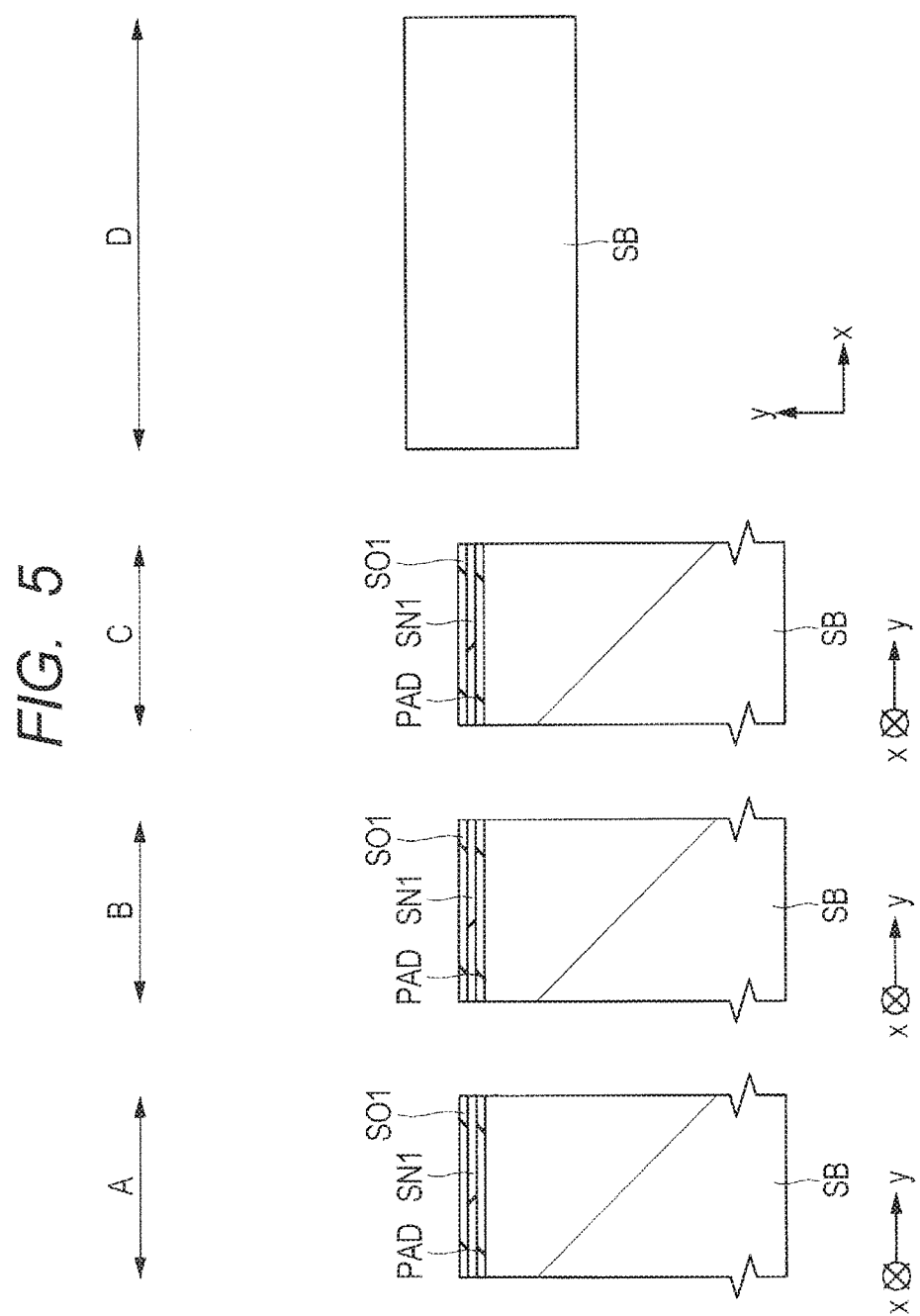
FIG. 5 shows cross-sectional views along line A, line B, and line C in FIG. 4 and a plan view along line D in FIG. 4.

First, referring to FIGS. 4 and 5, a semiconductor substrate SB is prepared, and an oxide film PAD is formed on a top surface of the semiconductor substrate SB, for example, by thermal oxidation. The oxide film PAD is a silicon oxide film, for example. Then, an insulating film SN1 is formed on the oxide film PAD, for example, by CVD (Chemical Vapor Deposition). The insulating film SN1 is formed by a silicon nitride film, for example, and has a thickness of about 5 nm to about 15 nm, for example. Then, an oxide film SO1 is formed on the insulating film SN1, for example, by CVD. The oxide film SO1 is formed by a silicon oxide film, for example, and has a thickness of about 5 nm to about 10 nm, for example.

Figure 6:
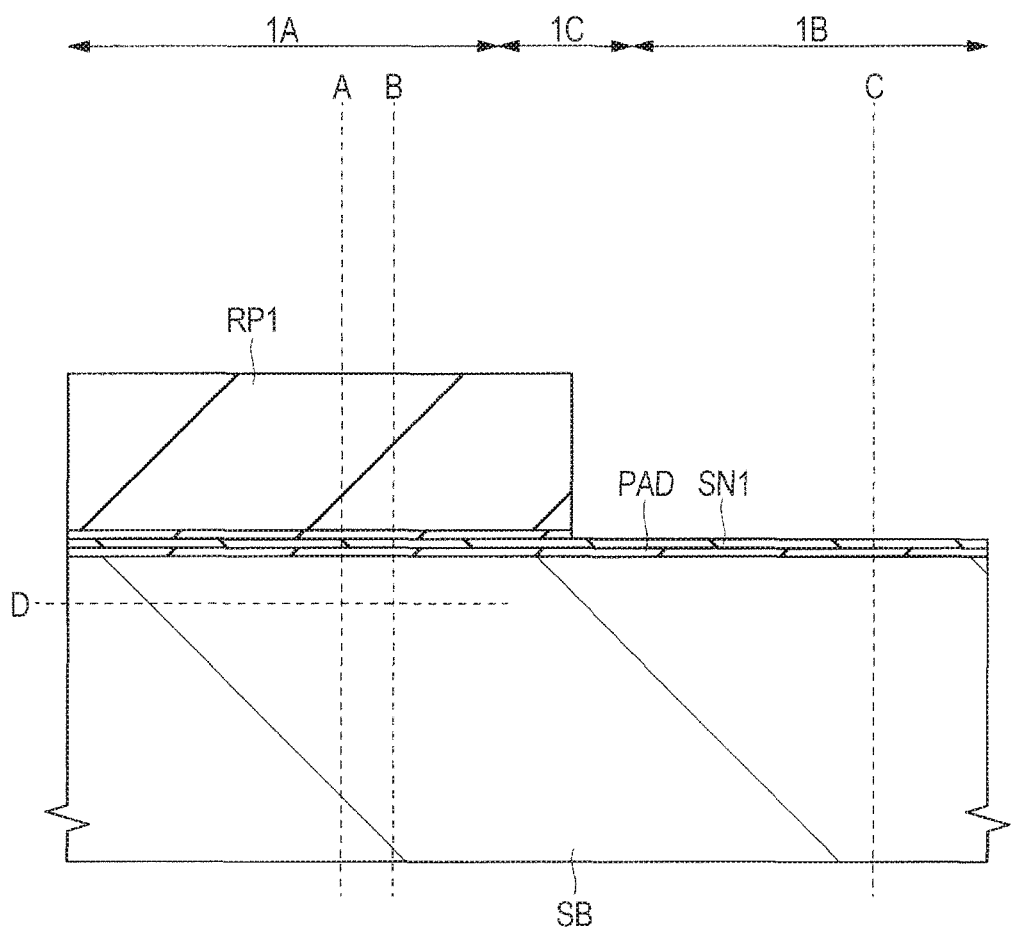
FIG. 6 shows a cross-sectional view explaining a manufacturing step of the semiconductor device, subsequent to FIG. 4.
Figure 7:
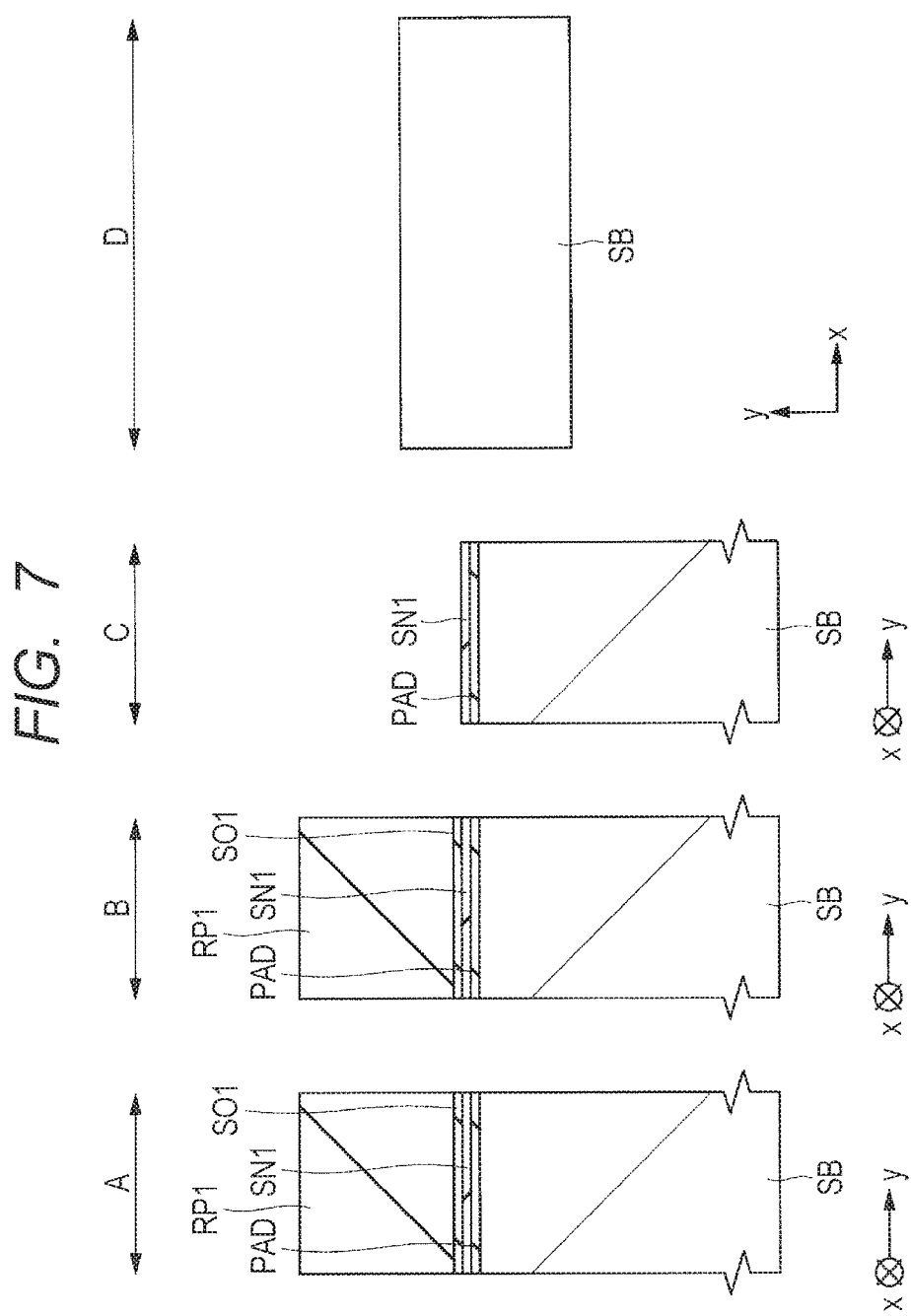
FIG. 7 shows cross-sectional views along line A, line B, and line C in FIG. 6 and a plan view along line D in FIG. 6.

Subsequently, referring to FIGS. 6 and 7, a resist pattern RP1 that is open in the peripheral circuit region 1B is formed. Then, the oxide film SO1 in the peripheral circuit region PR1 is removed by dry etching that uses the resist pattern RP1 as mask.

Figure 8:
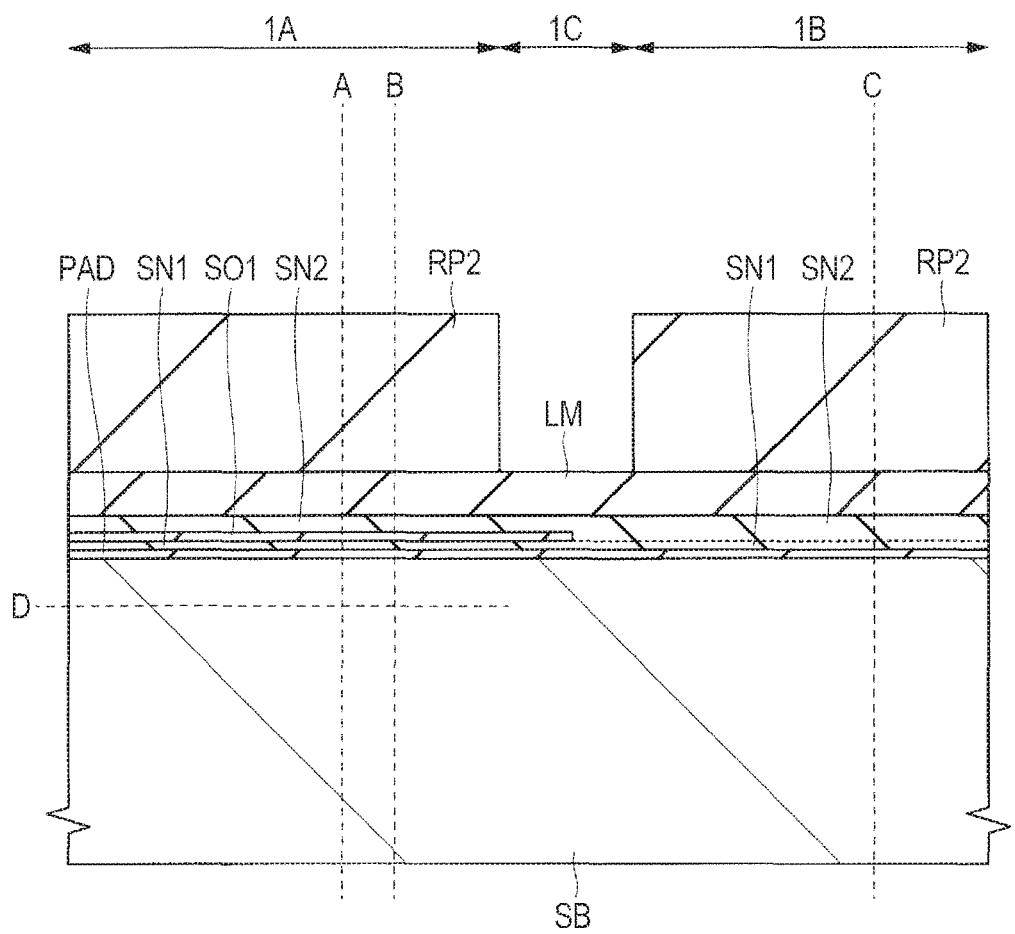
FIG. 8 shows a cross-sectional view explaining a manufacturing step of the semiconductor device, subsequent to FIG. 6.
Figure 9:
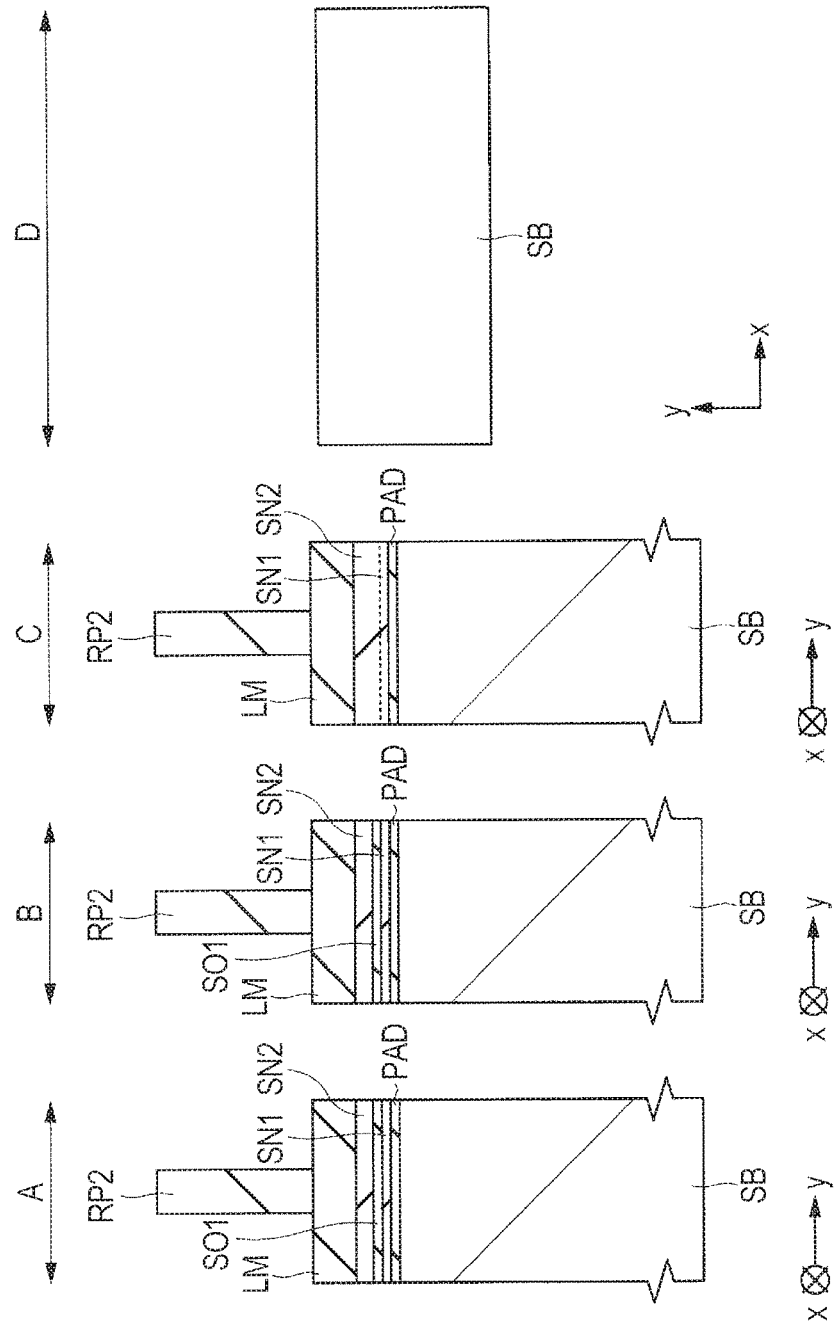
FIG. 9 shows cross-sectional views along line A, line B, and line C in FIG. 8 and a plan view along line D in FIG. 8.

Subsequently, referring to FIGS. 8 and 9, after the resist pattern RP1 is removed, an insulating film SN2 is formed on the top surface of the semiconductor substrate SB, for example, by CVD. The insulating film SN2 is formed by a silicon nitride film, for example, and has a thickness of about 75 nm to about 85 nm, for example.

At this stage, a multilayer film having a three-layer structure in which the insulating film SN1, the oxide film SO1, and the insulating film SN2 are sequentially formed (which may be referred to as the multilayer film of the insulating film SN2/the oxide film SO1/the insulating film SN1) is present on the oxide film PAD in the memory cell region 1A, and a multilayer film having a two-layer structure in which the insulating film SN1, and the insulating film SN2 are sequentially formed (which may be referred to as the multilayer film of the insulating film SN2/the insulating film SN1) is present on the oxide film PAD in the peripheral circuit region 1B. The thickness of each of the insulating films SN1 and SN2 is adjusted in such a manner that the thickness of the multilayer film of the insulating film SN2/the insulating film SN1 formed in the peripheral circuit region 1B is the same as the thickness of an insulating film required when a groove portion of STI is formed in the semiconductor substrate SB.

Subsequently, an lower-layer material LM is formed on the insulating film SN2, and thereafter a resist pattern RP2 that is open in a region where the groove portion of STI is to be formed is formed on the lower-layer material LM. In the boundary region 1C between the memory cell region 1A and the peripheral circuit region 1B, an end portion of the oxide film SO1 is located in the opening of the resist pattern RP2. This is to prevent particle emission that may be caused in a step of removing the insulating films SN1 and SN2 performed later.

Figure 10:
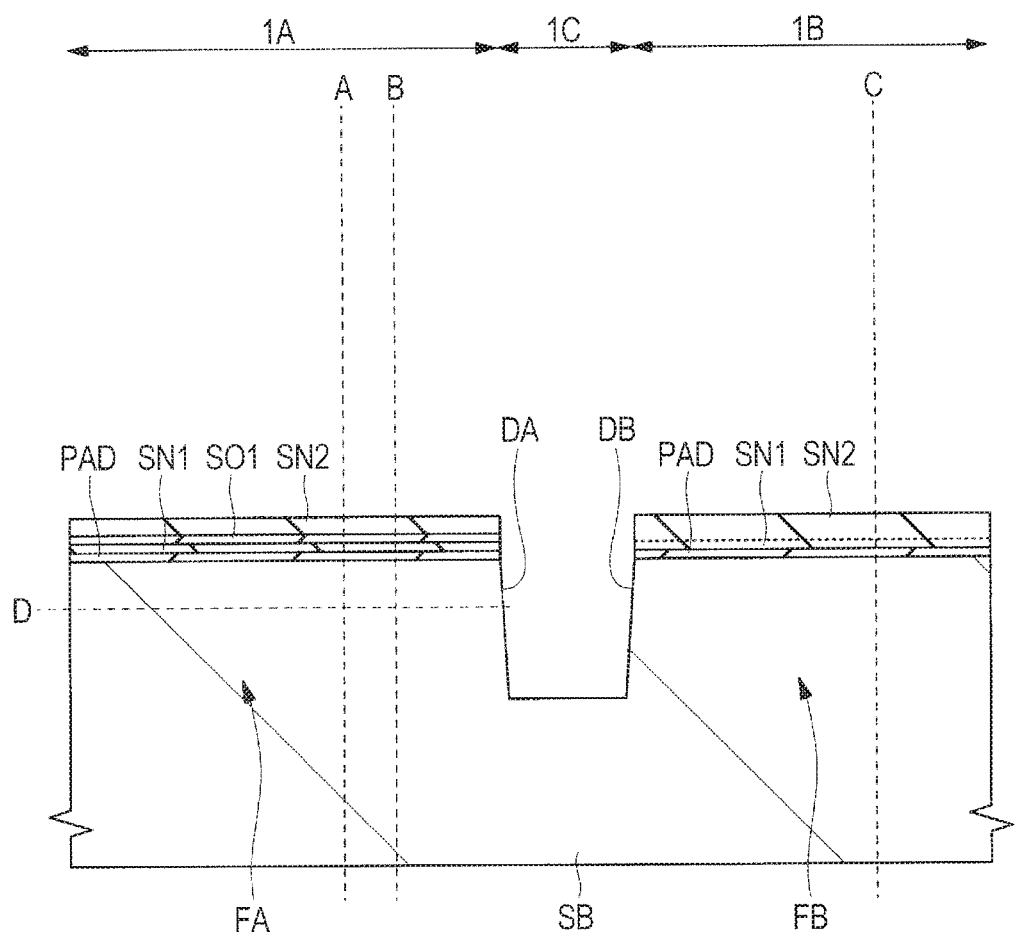
FIG. 10 shows a cross-sectional view explaining a manufacturing step of the semiconductor device, subsequent to FIG. 8.
Figure 11:
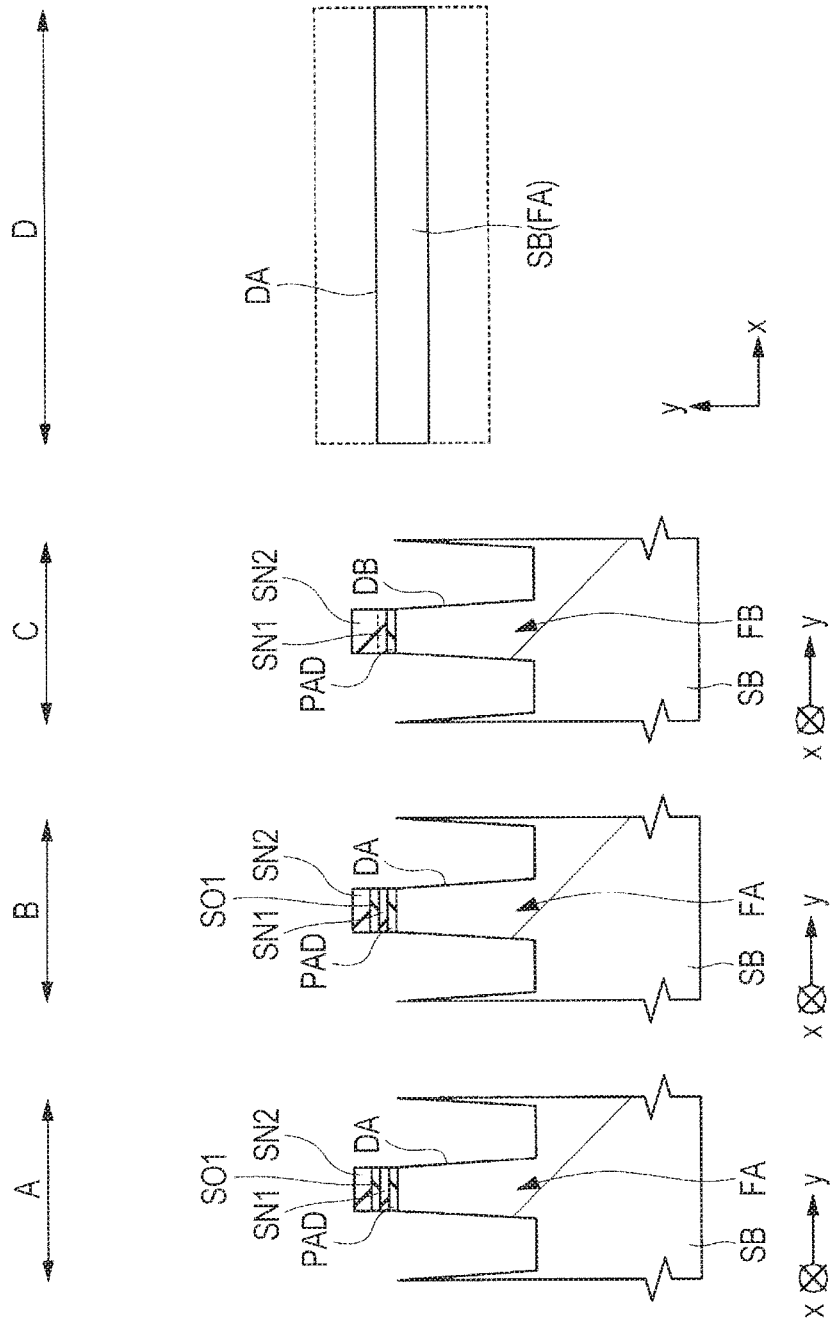
FIG. 11 shows cross-sectional views along line A, line B, and line C in FIG. 10 and a plan view along line D in FIG. 10.

Subsequently, referring to FIGS. 10 and 11, the lower-layer material LM is processed by dry etching that uses the resist pattern RP2 as mask. Then, the resist pattern RP2 is removed, and thereafter dry etching is performed by using the patterned lower-layer material LM as mask, so that the insulating film SN2, the oxide film SO1, the insulating film SN1, and the oxide film PAD are processed, and further a portion of the top surface of the semiconductor substrate SB is processed. Then, the lower-layer material LM is removed.

Thus, a fin FA that is formed by a portion of the semiconductor substrate SB, which includes the top surface of the semiconductor substrate SB, and projects upward from the top surface of the semiconductor substrate SB, and a groove DA around the fin FA are formed in the memory cell region 1A. Similarly, a fin FB that is formed by a portion of the semiconductor substrate SB, which includes the top surface of the semiconductor substrate SB, and projects upward from the top surface of the semiconductor substrate SB, and a groove DB around the fin FB are formed in the peripheral circuit region 1B.

Figure 12:
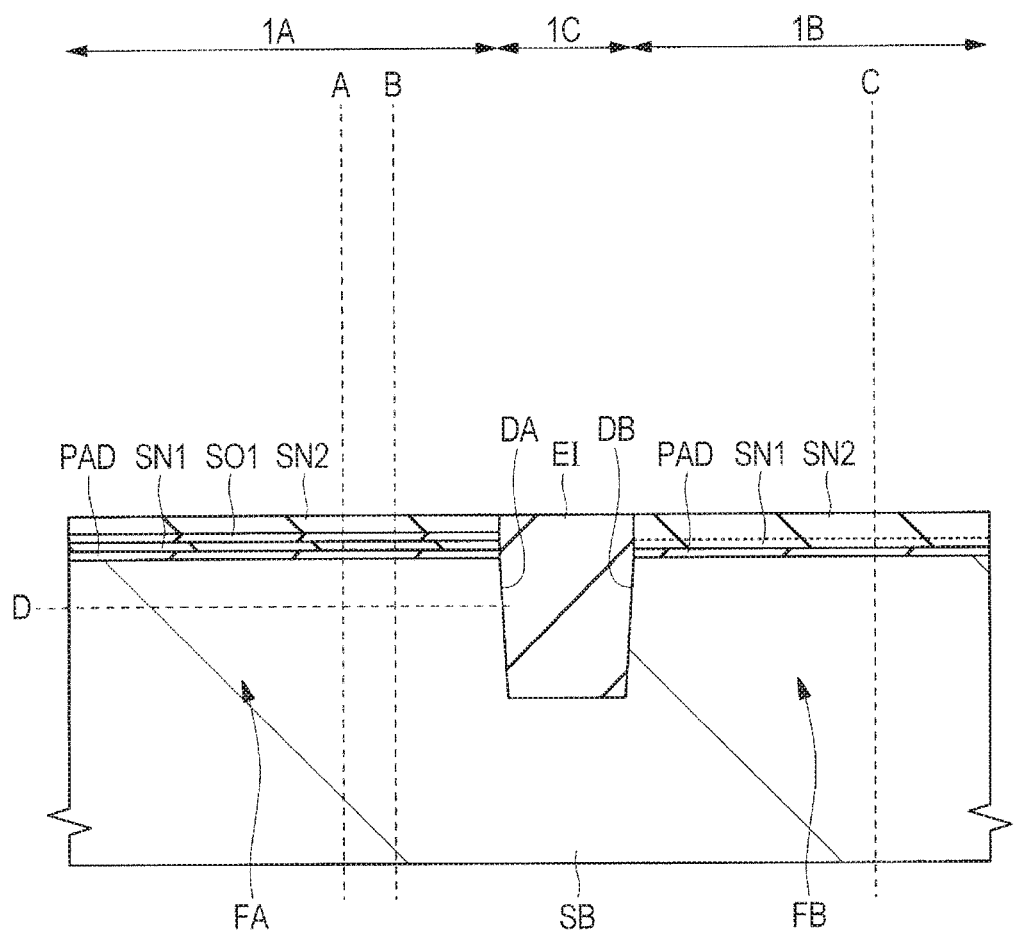
FIG. 12 shows a cross-sectional view explaining a manufacturing step of the semiconductor device, subsequent to FIG. 10.
Figure 13:
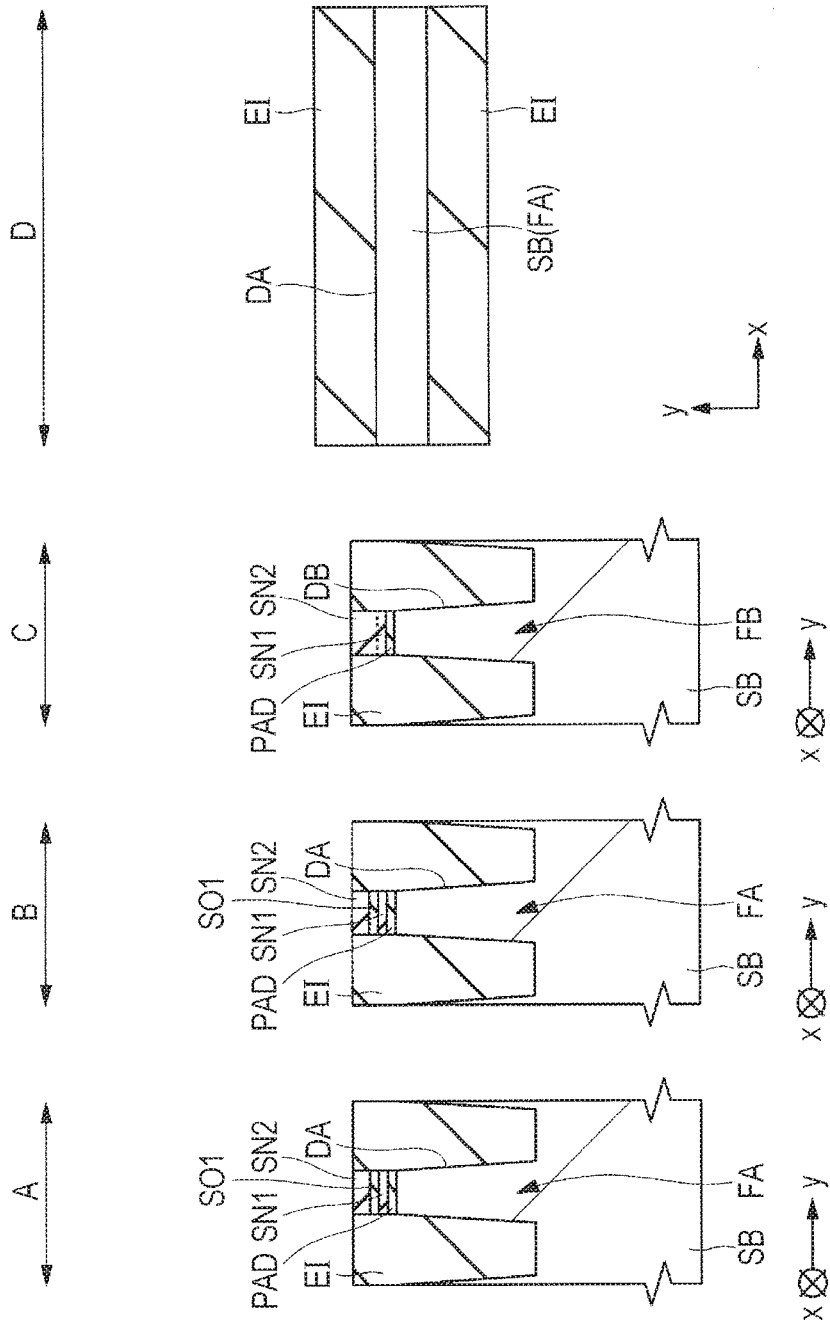
FIG. 13 shows cross-sectional views along line A, line B, and line C in FIG. 12 and a plan view along line D in FIG. 12.

Subsequently, referring to FIGS. 12 and 13, an insulating film EI is formed on the top surface of the semiconductor substrate SB to be embedded in the grooves DA and DB, for example, by CVD. The insulating film EI is formed by a TEOS (Tetra Ethyl Ortho Silicate; $Si(OC_2H_5)_4$) film, for example. Thereafter, a top surface of the insulating film EI is polished, for example, by CMP (Chemical Mechanical Polishing), until the top surface of the insulating film SN2 is exposed, so that the insulating film EI is embedded into the grooves DA and DB. STI that is an element isolation region is formed by the insulating film EI embedded in the grooves DA and DB.

Figure 14:
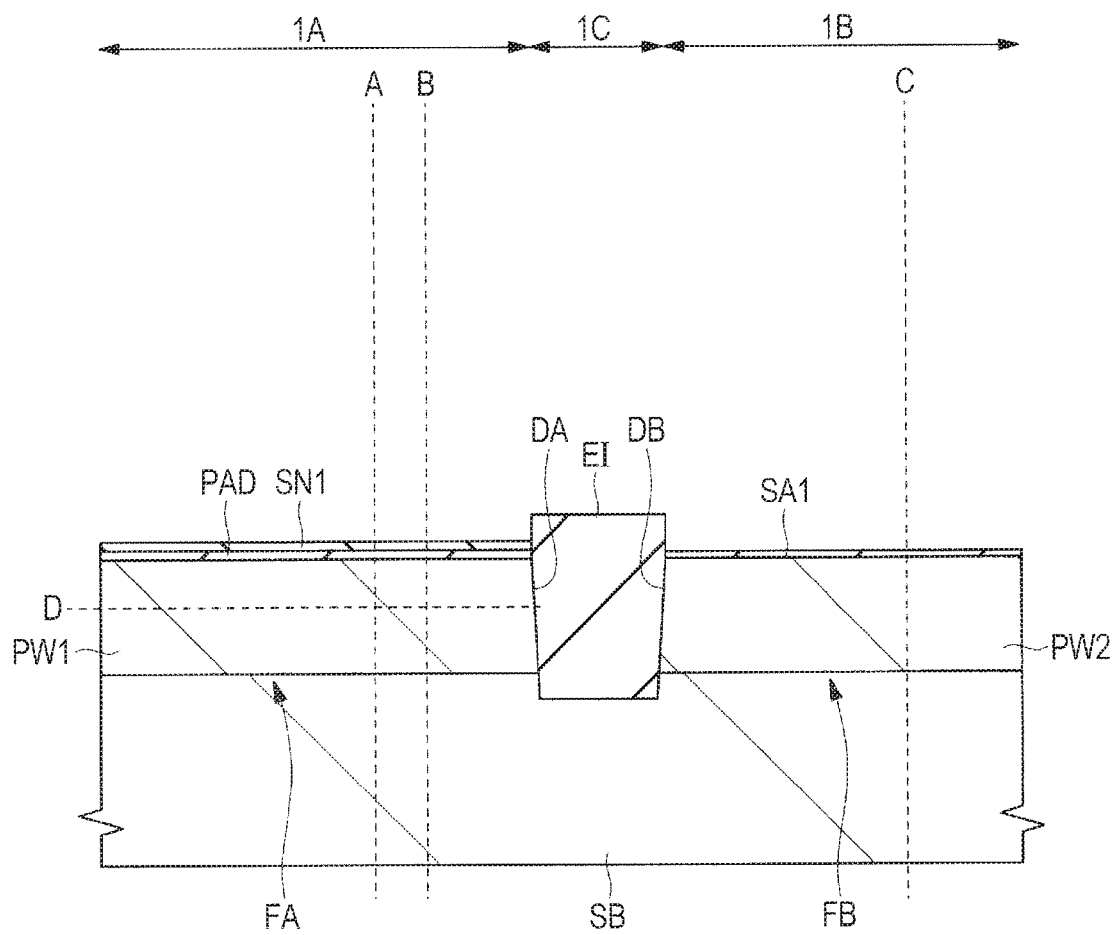
FIG. 14 shows a cross-sectional view explaining a manufacturing step of the semiconductor device, subsequent to FIG. 12.
Figure 15:
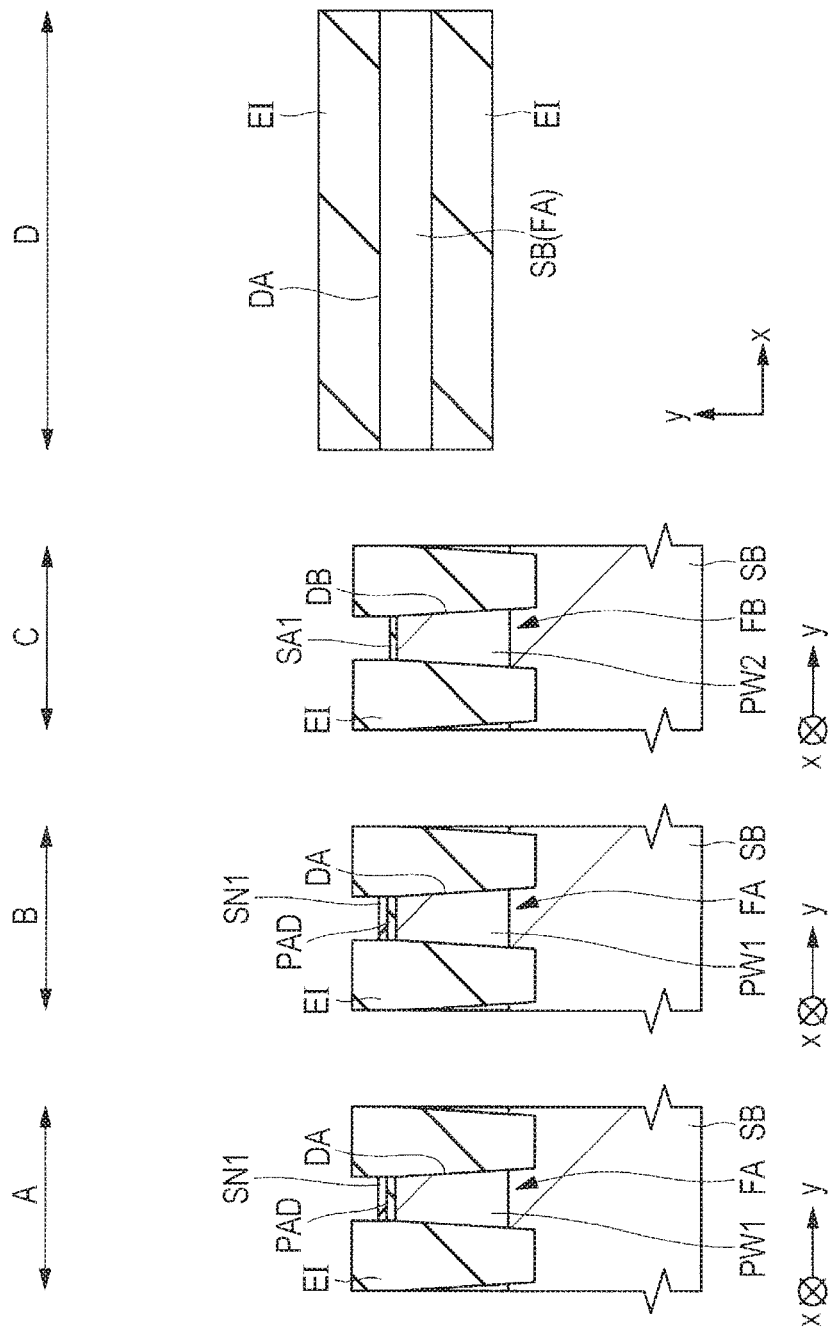
FIG. 15 shows cross-sectional views along line A, line B, and line C in FIG. 14 and a plan view along line D in FIG. 14.

Subsequently, referring to FIGS. 14 and 15, the insulating film SN2 is removed in the memory cell region 1A, and the insulating films SN1 and SN2 are removed in the peripheral circuit region 1B. When the insulating films SN1 and SN2 are removed in the peripheral circuit region 1B, the insulating film SN1 remains in the memory cell region 1A because the oxide film SO1 serves as a stopper.

Subsequently, the oxide film SO1 in the memory cell region 1A is removed, and the oxide film PAD in the peripheral circuit region 1B is removed. Thereafter, a sacrificial oxide film SA1 is formed on an exposed surface of the semiconductor substrate SB in the peripheral circuit region 1B. Then, in the memory cell region 1A, ions of a p-type impurity are implanted via the insulating film SN1 and the oxide film PAD to form a P-type well region PW1. Also, in the peripheral circuit region 1B, ions of an n-type impurity or a p-type impurity are implanted via the sacrificial oxide film SA1, to form an N-type well region (not illustrated) or a P-type well region PW2. An implanting energy, the dose amount, and the like in ion implantation are adjusted as appropriate.

Subsequently, referring to FIGS. 16 and 17, the top surface of the insulating film EI embedded in the groove DA or DB is etched back to be lowered, so that sidewalls of each of the fins FA and FB are exposed. This etchback may use either of dry etching and wet etching. By this etchback, the sacrificial oxide film SA1 in the peripheral circuit region 1B is removed, and a top surface and the sidewalls of the fin FB are exposed.

The above etchback for the top surface of the insulating film EI may be performed in the memory cell region 1A and in the peripheral circuit region 1B separately from each other. In this case, the etching is performed in one of the regions 1A and 1B while the other region is covered by a resist pattern. In this manner, the thickness of a portion of the fin FA, which is exposed from the insulating film EI, may be made different from the thickness of a portion of the fin FB, which is exposed from the insulating film EI.

Thus, in the memory cell region 1A, the multilayer film of the insulating film SN1/the oxide film PAD is formed on a top surface of the fin FA, and the sidewalls of the fin FA are exposed. Meanwhile, the top surface and the sidewalls of the fin FB are exposed in the peripheral circuit region 1B.

Figure 18:
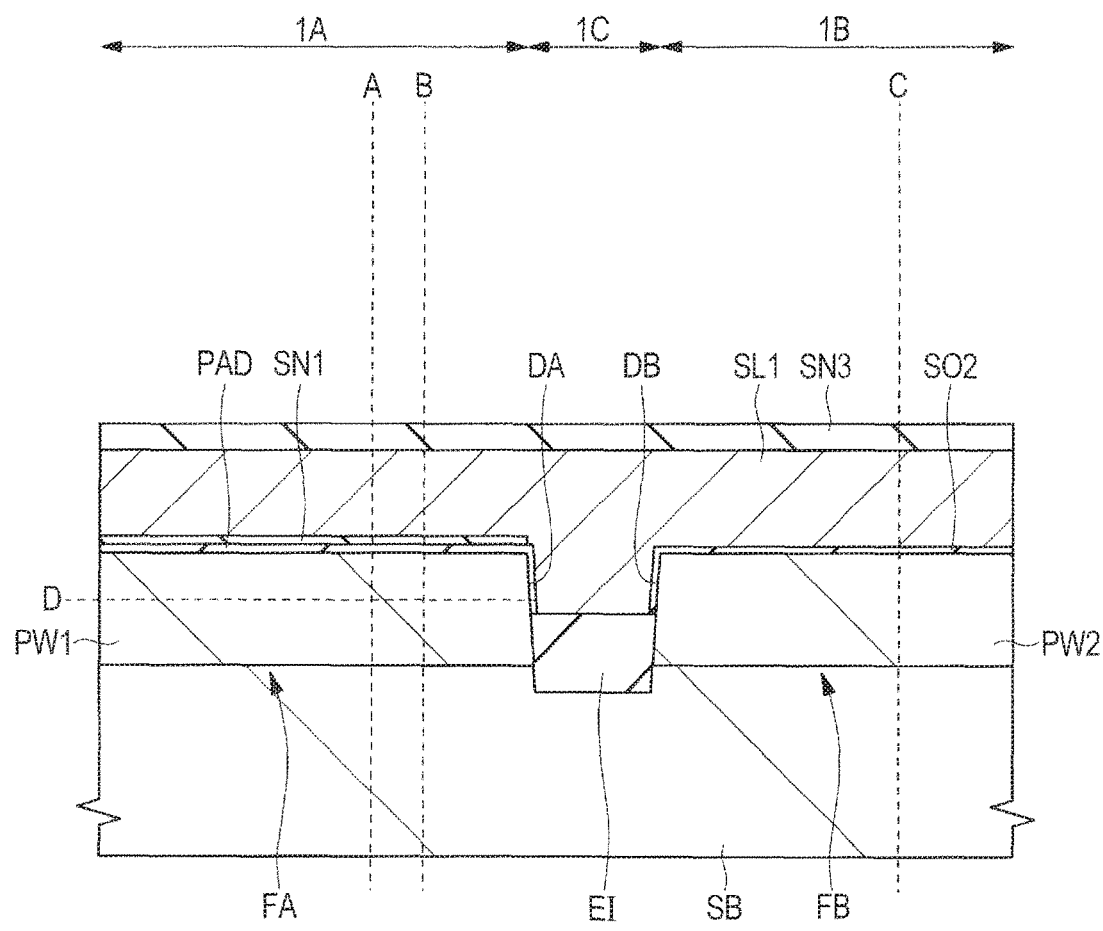
FIG. 18 shows a cross-sectional view explaining a manufacturing step of the semiconductor device, subsequent to FIG. 16.
Figure 19:
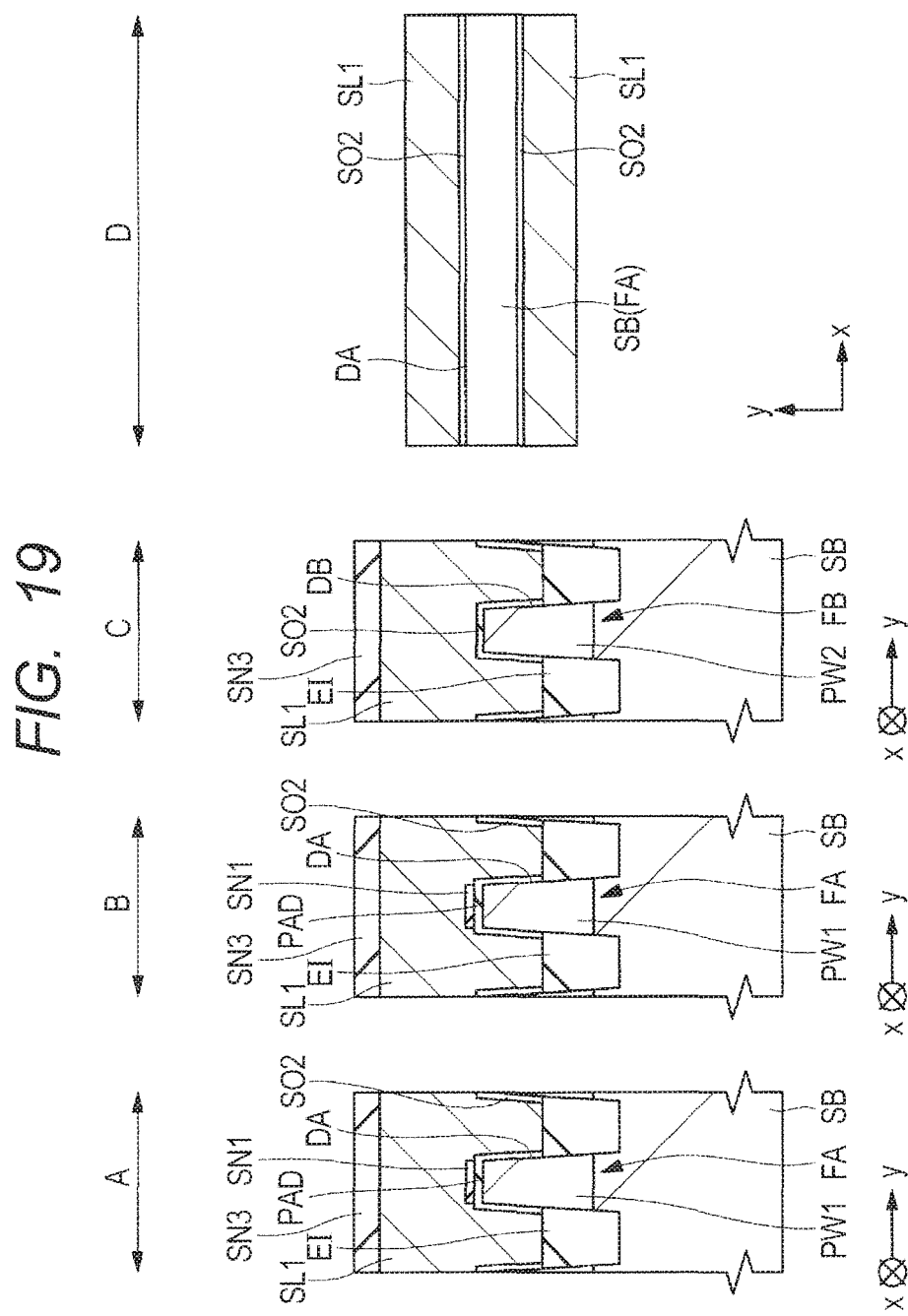
FIG. 19 shows cross-sectional views along line A, line B, and line C in FIG. 18 and a plan view along line D in FIG. 18.

Subsequently, referring to FIGS. 18 and 19, an oxide film SO2 is formed on the exposed sidewalls of the fin FA in the memory cell region 1A, and on the top surface and the sidewalls of the fin FB that are exposed in the peripheral circuit region 1B. The oxide film SO2 can be formed by thermal oxidation, for example, is formed by a silicon oxide film, for example, and has a thickness of about 5 nm to about 10 nm, for example.

Subsequently, a conductor film SL1 is formed on the top surface of the semiconductor substrate SB by CVD, for example, and thereafter a top surface of the conductor film SL1 is polished by CMP, for example, to be flattened. The conductor film SL1 is formed by a polycrystalline silicon film, for example. Then, an insulating film SN3 is formed on the conductor film SL1 by CVD, for example. The insulating film SN3 is formed by a silicon nitride film, for example.

Subsequently, referring to FIGS. 20 and 21, a resist pattern (not illustrated) is formed to cover the peripheral circuit region 1B and expose a portion of the memory cell region 1A and a portion of the boundary region 1C. Then, dry etching using that resist pattern as mask is performed to process the insulating film SN3 and the conductor film SL1 in the portion of the memory cell region 1A and the portion of the boundary region 1C, and to remove the exposed oxide film SO2.

By this step, in the memory cell region 1A, a control gate electrode CG of a control transistor, formed by the conductor film SL1, is obtained, and a gate insulating film GA of the control transistor, formed by the oxide film SO2 on the sidewalls of the fin FA, is obtained. Thereafter, the resist pattern is removed.

The control gate electrode CG is arranged to extend in y-direction and cross over a plurality of fins FA. However, there is the multilayer film of the insulating film SN1/the oxide film PAD between the control gate electrode CG and the top surface of the fin FA, and this multilayer film does not function as the gate insulating film GA of the control transistor. Therefore, the control gate electrode CG has a double-gate structure that uses the oxide film SO2 formed on the sidewalls on both sides of the fin FA as the gate insulating film GA.

Further, because the multilayer film of the insulating film SN1/the oxide film PAD, which is larger in thickness than the oxide film SO2 formed between the control gate electrode CG and the sidewalls of the fin FA, is formed between the control gate electrode CG and the top surface of the fin FA, concentration of an electric field onto a tip portion of the fin FA can be alleviated.

In the memory cell region 1A, the top surfaces of the multilayer film of the insulating film SN1/the oxide film PAD and the insulating film EI on the top surface of the fin FA are exposed in a region other than a portion at which the control gate electrode CG is formed. Further, by the above etching, the oxide film SO2 formed on the sidewalls of the fin FA is removed, so that the sidewalls of the fin FA is exposed.

Subsequently, a sacrificial oxide film is formed on the exposed surface of the fin FA, although not illustrated. Thereafter, ions of an impurity for adjusting a threshold value of a memory transistor are implanted into the fin FA.

Subsequently, referring to FIGS. 22 and 23, cleaning that uses hydrofluoric acid aqueous solution, for example, is performed to remove the above-described sacrifice oxide film, and thereafter the exposed sidewalls of the fin FA and exposed sidewalls of the control gate electrode CG are oxidized by thermal oxidation, for example. By this step, a silicon oxide film X1 covering the sidewalls of the fin FA and the sidewalls of the control gate electrode CG is formed. While the insulating film SN1 is formed on the top surface of the fin FA and the insulating film SN3 is formed on the control gate electrode CG, the exposed surfaces of the insulating films SN1 and SN3 are also oxidized by the above thermal oxidation, so that the silicon oxide film X1 is formed on the exposed surfaces of the insulating films SN1 and SN3. However, the thickness of the silicon oxide film X1 formed on the exposed surfaces of the insulating films SN1 and SN3 is thinner than that of the silicon oxide film X1 formed on the sidewalls of the fin FA.

Subsequently, a silicon nitride film N1 is formed on the top surface of the semiconductor substrate SB by CVD, for example. The silicon nitride film N1 functions as a trap insulating film for storing charges in a memory cell formed later. Although it is described that the silicon nitride film N1 is formed as a charge storage film here, the material for the charge storage film is not limited to the silicon nitride film. For example, an insulating film of hafnium silicate (HfSiO) may be formed, for example. Then, a silicon oxide film X2 is formed on the silicon nitride film N1 by CVD, for example.

A multilayer film having a three-layer structure in which the silicon oxide film X1, the silicon nitride film N1, and the silicon oxide film X2 are sequentially formed (which may be referred to as the multilayer film of the silicon oxide film X2/the silicon nitride film N1/the silicon oxide film X1), formed on the top surface of the semiconductor substrate SB, includes an ONO film ON. The ONO film ON in contact with the side surfaces of the control gate electrode CG includes the silicon oxide film X1, the silicon nitride film N1, and the silicon oxide film X2 formed in that order in x-direction from the control gate electrode CG side. A top oxide film of the ONO film ON that is an uppermost layer is not limited to the silicon oxide film, but may be an alumina ($Al_2O_3$) film, for example.

Figure 25:
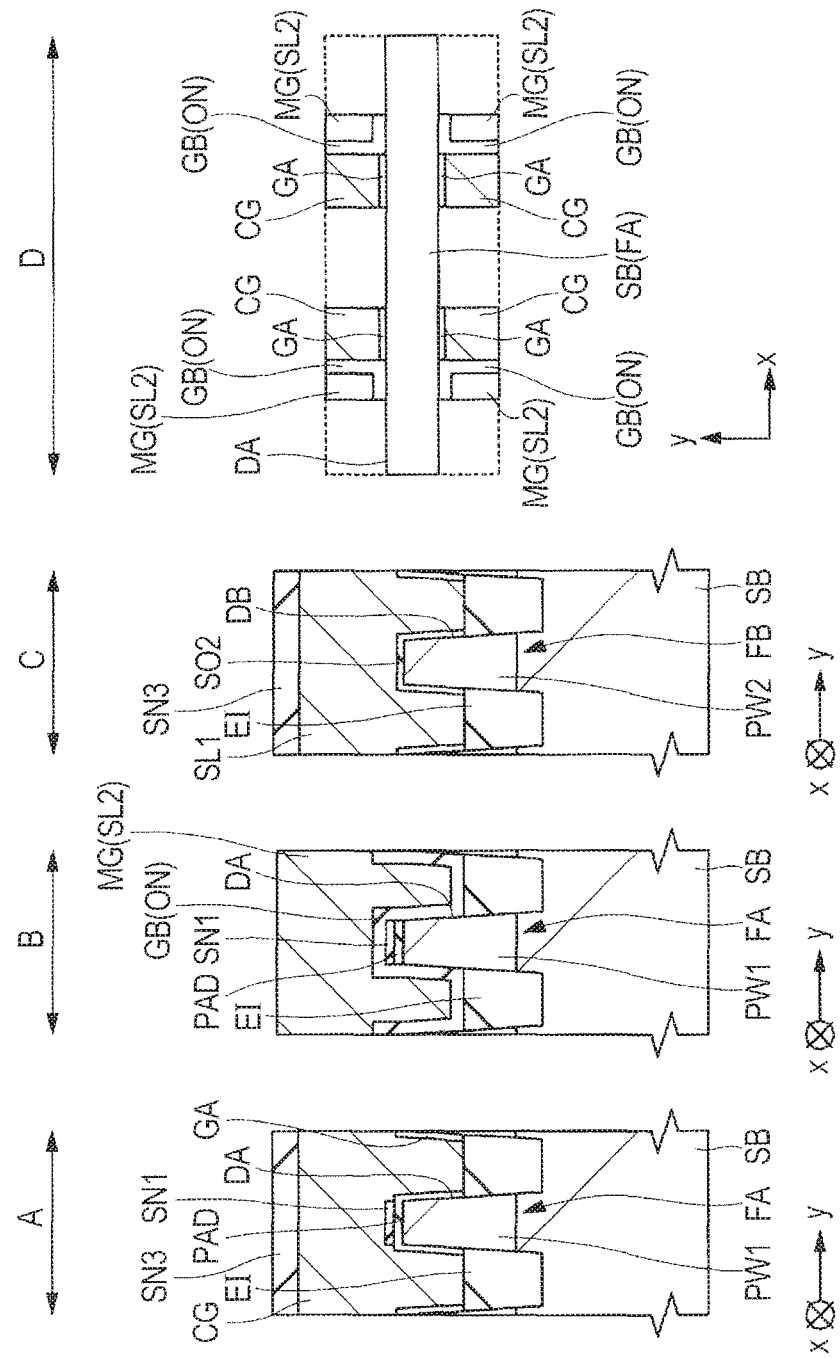
FIG. 25 shows cross-sectional views along line A, line B, and line C in FIG. 24 and a plan view along line D in FIG. 24.

Subsequently, referring to FIGS. 24 and 25, a conductor film SL2 is formed on the ONO film ON. The conductor film SL2 is formed by a polycrystalline silicon film, for example. The thickness of the conductor film SL2 is equal to or larger than the thickness of a multilayer film of the control gate electrode CG and the insulating film SN3 on the control gate electrode CG.

Subsequently, the conductor film SL2 is processed by anisotropic dry etching to form memory gate electrodes MG of memory transistors, which are respectively formed by the conductor film SL2 on both sides of the control gate electrode CG via the ONO film ON.

Subsequently, the memory gate electrode MG adjacent to one side surface of the control gate electrode CG is removed by isotropic etching that uses a resist pattern as mask. Thus, the memory gate electrode MG adjacent to the other side surface of the control gate electrode CG remains. Thereafter, the resist pattern is removed. Then, the ONO film ON exposed from the memory gate electrode MG is removed.

That is, the ONO film ON remains only between the memory gate electrode MG and the fin FA and between the memory gate electrode MG and the control gate electrode CG. Therefore, in the memory cell region 1A, the multilayer film of the insulating film SN1/the oxide film PAD on the top surface of the fin FA, the sidewalls of the fin FA, and the top surface of the insulating film EI are exposed in a region exposed from the control gate electrode CD and the memory gate electrode MG.

Further, the ONO film ON extending along the top surface of the fin FA, that is, along the semiconductor substrate SB and the ONO film ON extending along the side surface of the control gate electrode CG are continuously formed and form an L-shaped cross-section. On the fin FA is formed a pair of patterns each having the control gate electrode CG and the memory gate electrode MG adjacent to the control gate electrode CG via the ONO film ON. The control gate electrodes CG of the pair are opposed to each other between the memory gate electrodes MG of the pair.

The memory gate electrode MG is arranged to extend in y-direction and cross over a plurality of fins FA. Although the multilayer film of the insulating film SN1/the oxide layer PAD is provided between the memory gate electrode MG and the top surface of the fins FA, this multilayer does not function as a gate insulating film GB of the memory transistor. Therefore, the memory gate electrode MG has a double-gate structure that uses the ONO film formed on the sidewalls on both sides of the fin FA functions as the gate insulating film GB.

Further, a stacked film of the multilayer film of the insulating film SN1/the oxide film PAD and the ONO film ON, which is larger in thickness than the ONO film ON formed between the memory gate electrode MG and the sidewalls of the fin FA, is formed between the memory gate electrode MG and the top surface of the fin FA. Therefore, concentration of an electric field onto a tip portion of the fin FA can be alleviated.

Figure 26:
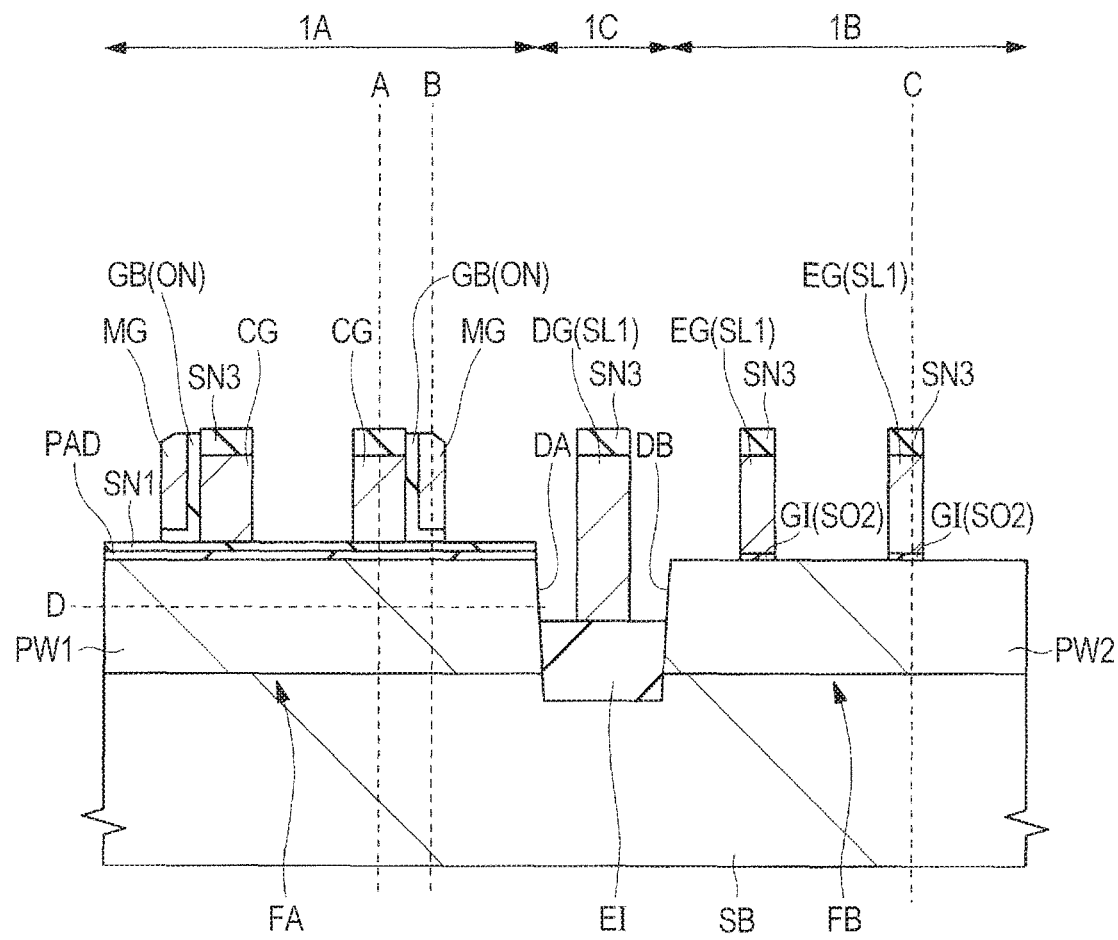
FIG. 26 shows a cross-sectional view explaining a manufacturing step of the semiconductor device, subsequent to FIG. 24.
Figure 27:
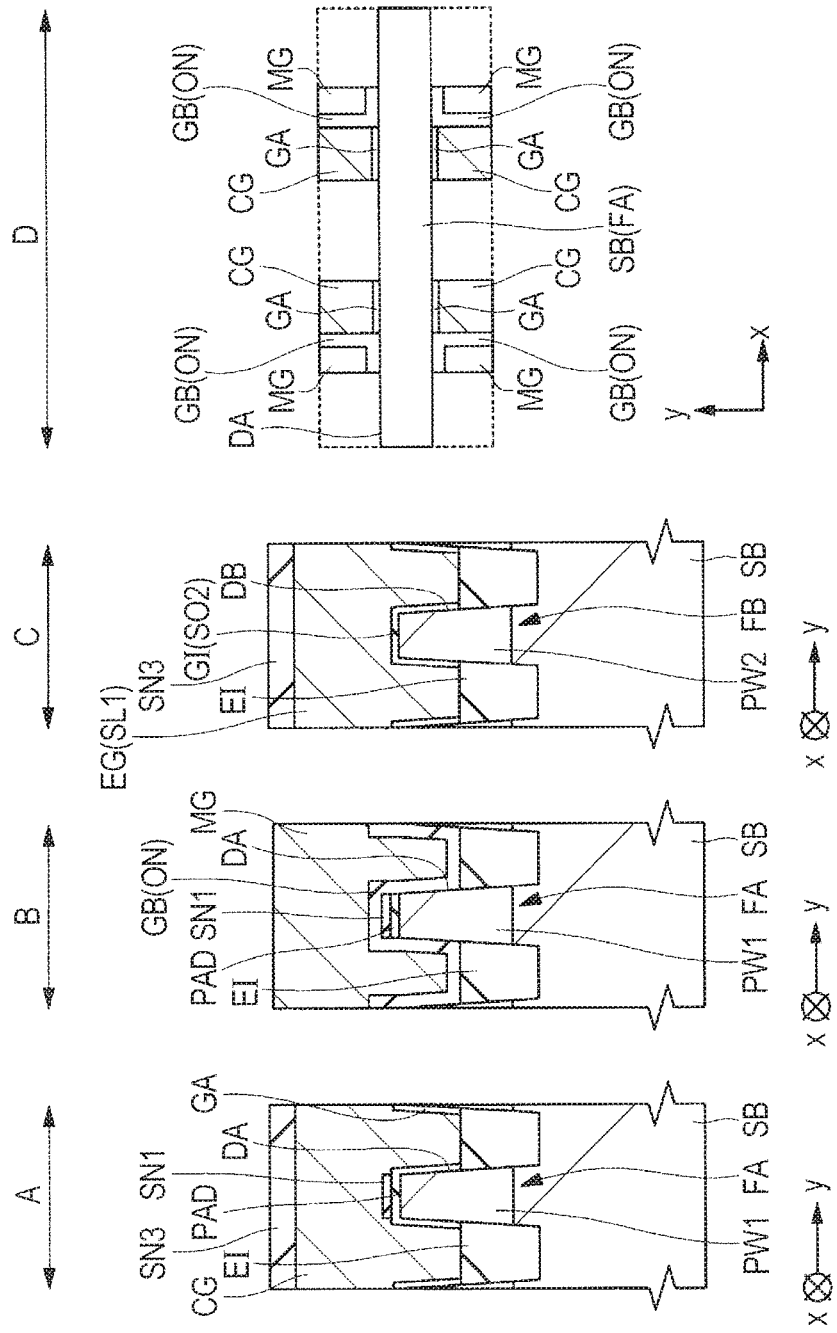
FIG. 27 shows cross-sectional views along line A, line B, and line C in FIG. 26 and a plan view along line D in FIG. 26.

Subsequently, referring to FIGS. 26 and 27, a resist pattern (not illustrated) is formed to cover the memory cell region 1A and expose a portion of the peripheral circuit region 1B and a portion of the boundary region 1C. Then, by dry etching that uses that resist pattern as mask, the insulating film SN3 in the portion of the peripheral circuit region 1B and in the portion of the boundary region 1C is processed, and thereafter the conductor film SL1 is processed.

By this step, in the peripheral circuit region 1B, a gate electrode EG of a transistor, formed by the conductor film SL1, is obtained and a gate insulating film GI of the transistor, formed by the oxide film SO2 formed on the top surface and the sidewalls of the fin FB is obtained. Similarly, a dummy gate electrode DG formed by the conductor film SL1 is obtained in the boundary region 1C. Thereafter, the resist pattern is removed.

In the peripheral circuit region 1B, the gate electrode EG is arranged to cross over the fin FB. However, unlike the control gate electrode CG and the memory gate electrode MG described above, the gate insulating film GI formed by the oxide film SO2 is provided between the gate electrode EG and the top surface and the sidewalls of the fin FB. Therefore, the gate electrode EG has a triple-gate structure that uses the insulating film SO2 formed on the top surface and the sidewalls on both sides of the fin FB as the gate insulating film GI.

On the top surface of the fin FB in the peripheral circuit region 1B, a pair of multilayer films each formed by the gate electrode EG and the insulating film SN3 on the gate electrode EG is provided directly above the fin FB in such a manner that those multilayer films are arranged in x-direction. The top surface and the sidewalls of the fin FB are exposed in a region other than a portion at which the gate electrode EG is formed.

In the boundary region 1C is provided a multilayer film of the dummy gate electrode DG and the insulating film SN3 on the dummy gate electrode DG. Due to this multilayer film, it is possible to improve flatness of an interlayer insulating film formed later, for example.

Figure 28:
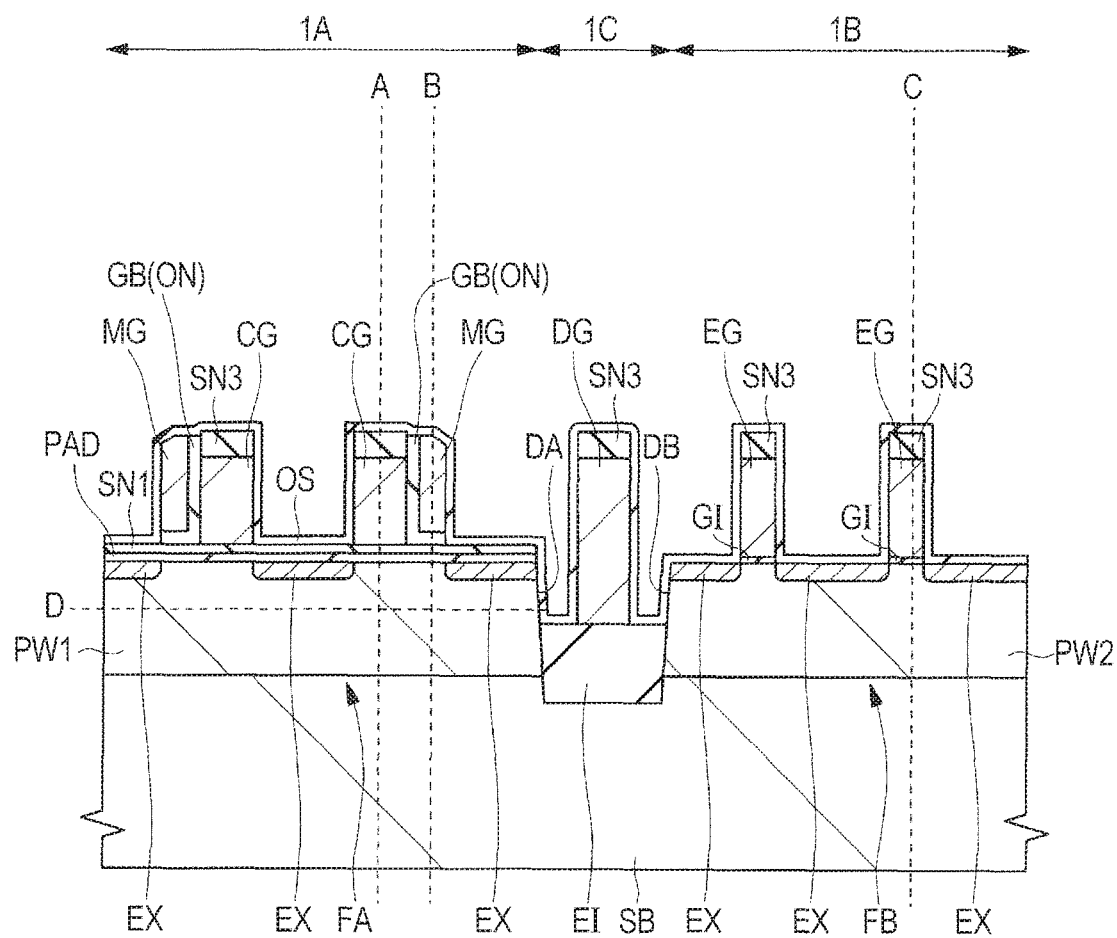
FIG. 28 shows a cross-sectional view explaining a manufacturing step of the semiconductor device, subsequent to FIG. 26.
Figure 29:
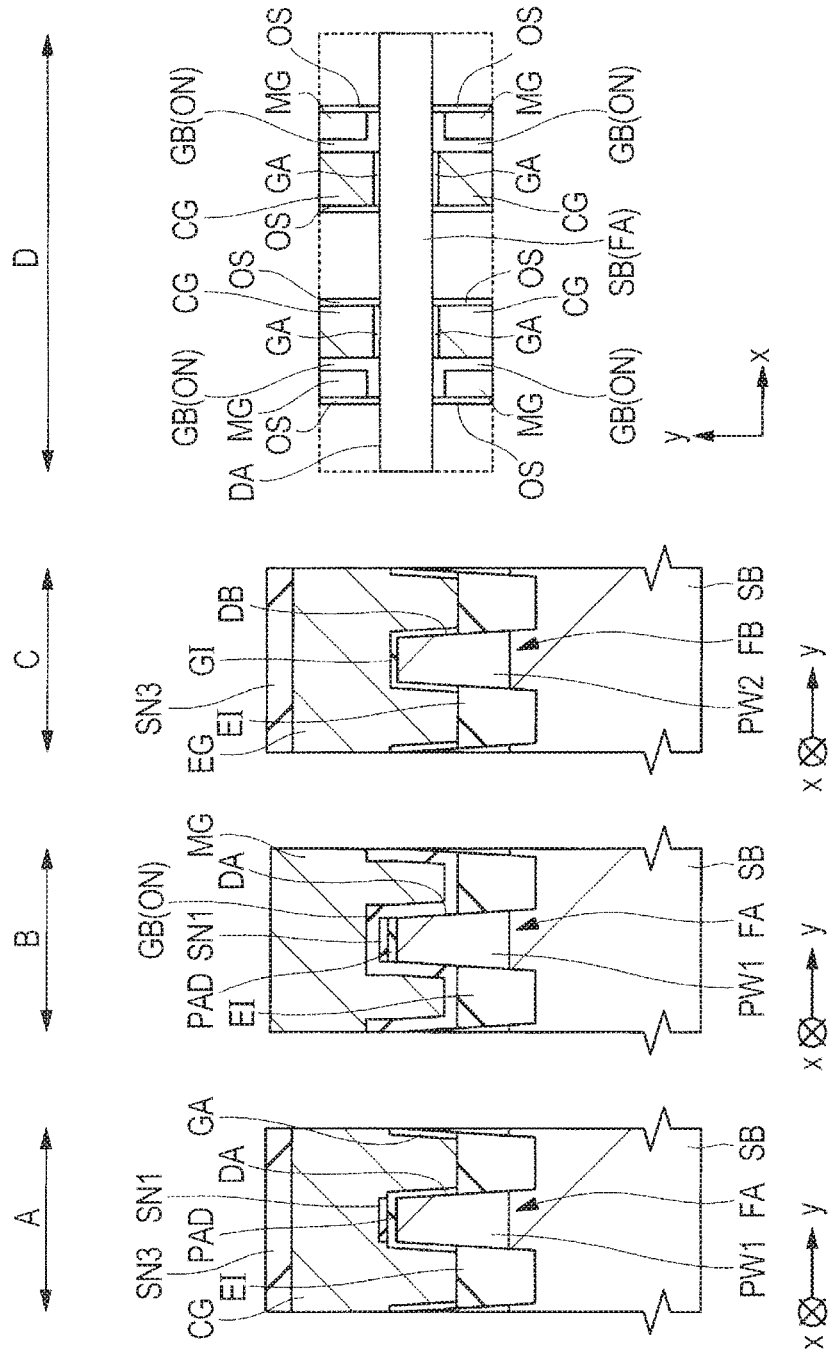
FIG. 29 shows cross-sectional views along line A, line B, and line C in FIG. 28 and a plan view along line D in FIG. 28.

Subsequently, referring to FIGS. 28 and 29, an offset spacer OS is formed on the top surface of the semiconductor substrate SB by CVD, for example. Then, ions of an n-type impurity (for example, phosphorous (P) or arsenic (As)) are implanted into the top surfaces of the fins FA and FB by using the insulating film SN3, the control gate electrode CG, the memory gate electrode MG, and the ONO film ON as mask in the memory cell region 1A and by using the insulating film SN3 and the gate electrode EG as mask in the peripheral circuit region 1B.

By this ion implantation, a plurality of extension regions EX that are n-type semiconductor regions with a relatively low impurity concentration are formed. The extension region EX in the memory cell region 1A is formed in the top surface of the fin FA next to a pattern that has the control gate electrode CG and the memory gate electrode MG adjacent to the control gate electrode CG via the ONO film ON. Further, the extension region EX in the peripheral circuit region 1B is formed in the top surface of the fin FB next to the gate electrode EG. In this step, ions of a p-type impurity (for example, boron (B)) may be performed for the fins FA and GB as halo implantation, as necessary.

Figure 30:
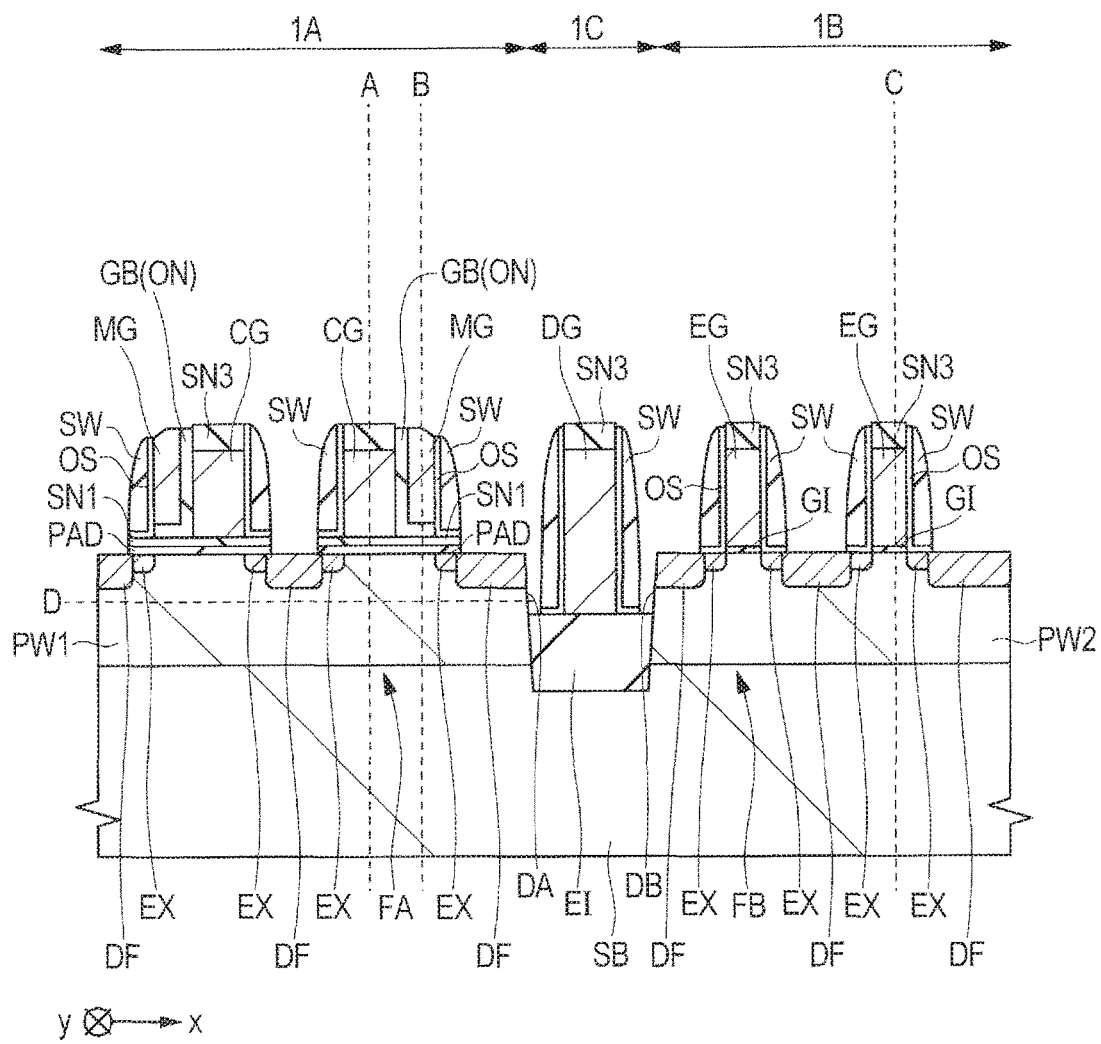
FIG. 30 shows a cross-sectional view explaining a manufacturing step of the semiconductor device, subsequent to FIG. 28.
Figure 31:
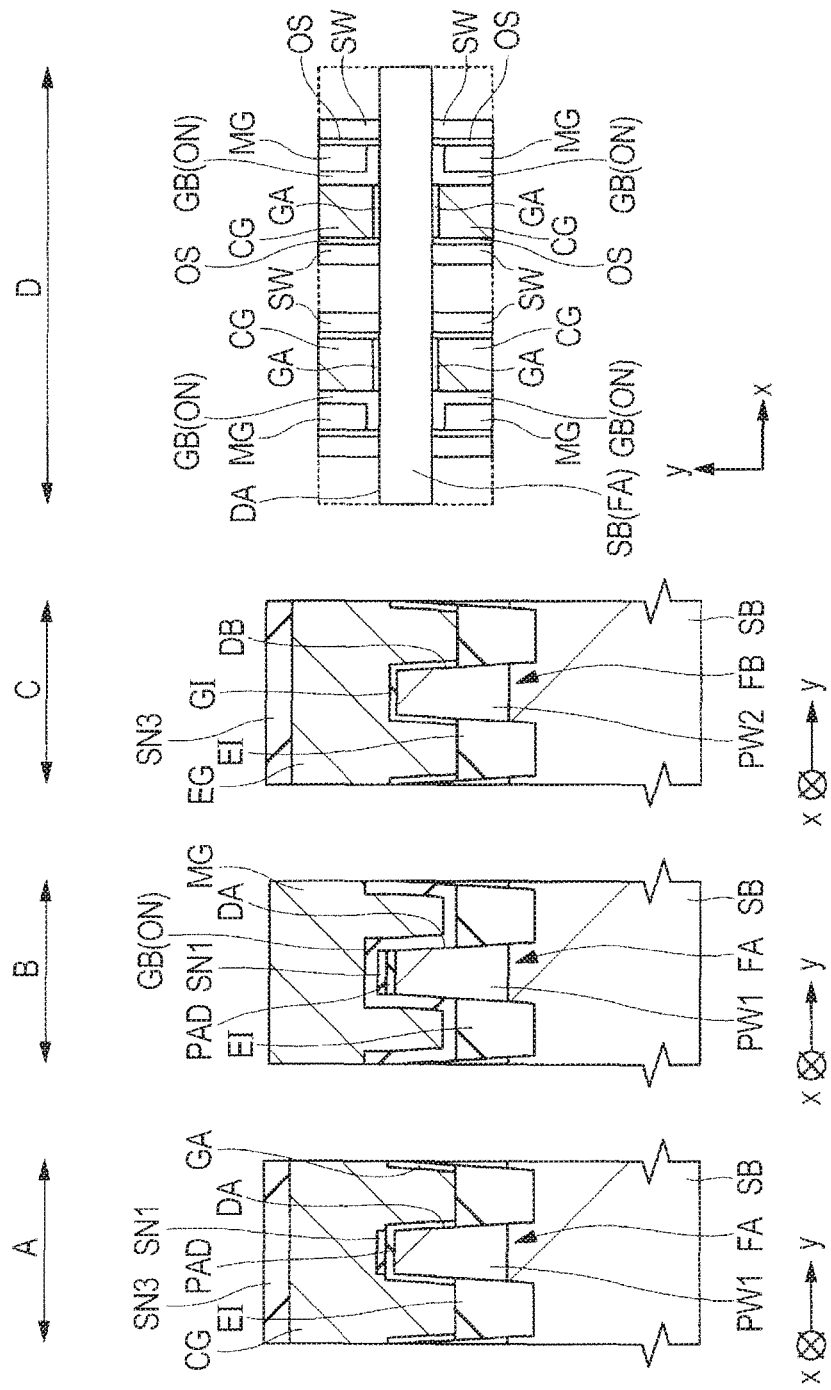
FIG. 31 shows cross-sectional views along line A, line B, and line C in FIG. 30 and a plan view along line D in FIG. 30.

Subsequently, referring to FIGS. 30 and 31, a silicon oxide film, a silicon nitride film, and a silicon oxide film, for example, are sequentially formed on a principal surface of the semiconductor substrate SB by CVD, for example, and are processed by anisotropic dry etching. By this step, a side wall SW is formed on the side surface of the control gate electrode CG and the side surface of the memory gate electrode MG in the memory cell region 1A, on the side surfaces on both sides of the gate electrode EG in the peripheral circuit region 1B, and the side surfaces on both sides of the dummy gate electrode DG in the boundary region 1C via the offset spacer OS, for example.

Then, the offset spacer OS exposed from the sidewall SW is removed. Further, the multilayer film of the insulating film SN1/the oxide film PAD exposed in the top surface of the fin FA is removed.

Then, ions of an n-type impurity (for example, phosphorous (P) or arsenic (As)) are implanted into the top surfaces of the fins FA and FB by using the insulating film SN3, the control gate electrode CG, the memory gate electrode MG, the ONO film ON, and the sidewall SW as mask in the memory cell region 1A and by using the insulating film SN3, the gate electrode EG, and the sidewall SW as mask in the peripheral circuit region 1B.

By this ion implantation, a plurality of diffusion layers DF that are n-type semiconductor regions with a relatively high impurity concentration are formed. The diffusion layer DF in the memory cell region 1A is formed in the top surface of the fin FA next to the pattern that has the control gate electrode CG and the memory gate electrode MG adjacent to the control gate electrode CG via the ONO film ON. Also, the diffusion layer DF in the peripheral circuit region 1B is formed in the top surface of the fin FB next to the gate electrode EG.

The diffusion layer DF is arranged at a farther position from the control gate electrode CG, the memory gate electrode MG, or the gate electrode EG in x-direction, as compared with the extension region EX in contact with the diffusion layer DF. The diffusion layer DF is formed at a deeper level than the extension region EX and has a higher concentration of n-type impurity than the extension region EX. The extension region EX and the diffusion layer DF that are in contact with each other include a source/drain region of a transistor. Thereafter, a heat treatment is performed in order to activate the impurity in the extension region EX and the diffusion layer DF as necessary.

It is described here that the source/drain regions in the memory cell region 1A and the peripheral circuit region 1B are formed by the same step. However, in the memory cell region 1A where a memory cell with a higher breakdown voltage as compared with a transistor formed in the peripheral circuit region 1B, it is considered that an impurity concentration of the source/drain region is set to be larger than that of the source/drain region in the peripheral circuit region 1B. Therefore, a step of forming the extension region EX and the diffusion layer DF in the memory cell region 1A and a step of forming the extension region EX and the diffusion layer DF in the peripheral circuit region 1B may be performed separately from each other.

Figure 32:
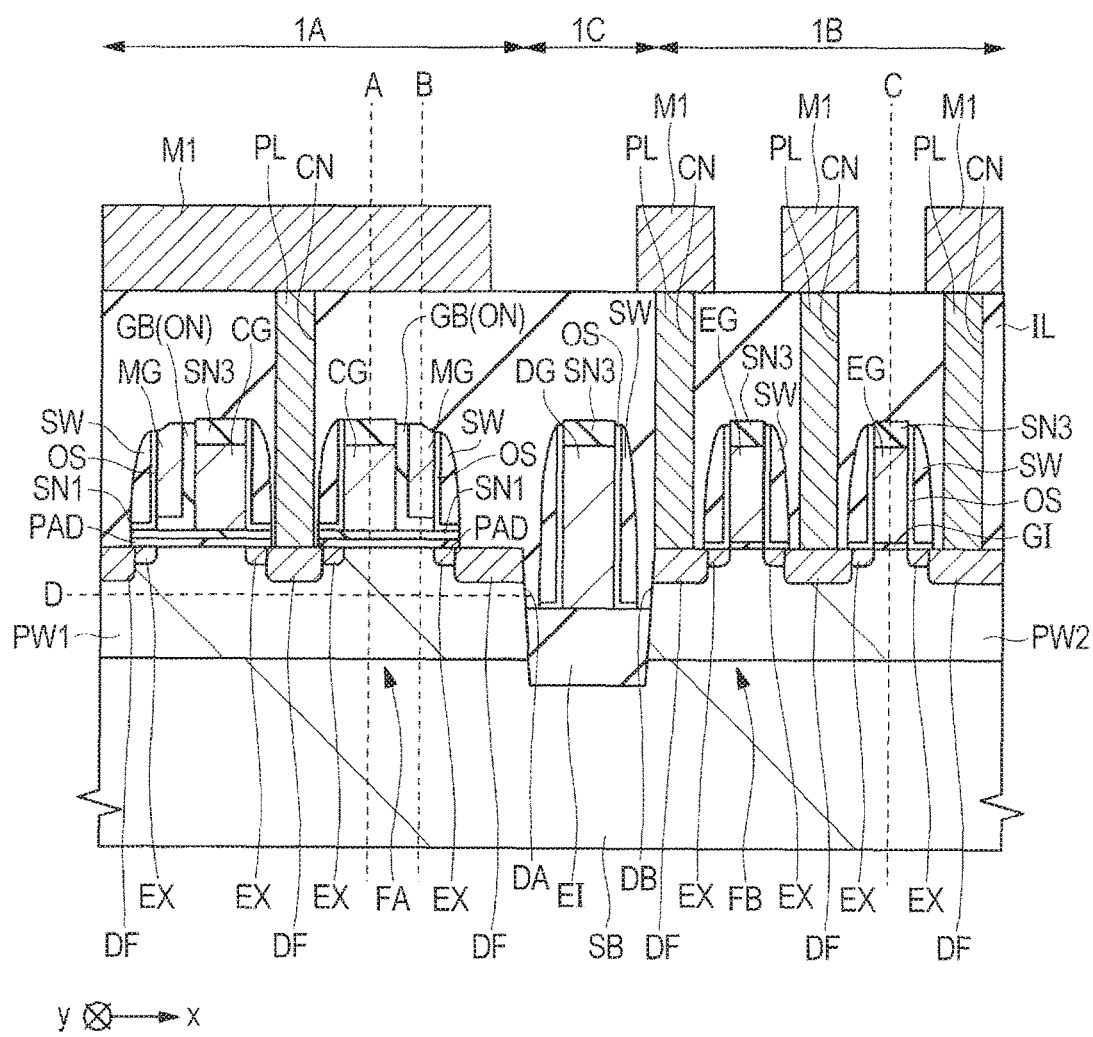
FIG. 32 shows a cross-sectional view explaining a manufacturing step of the semiconductor device, subsequent to FIG. 30.
Figure 33:
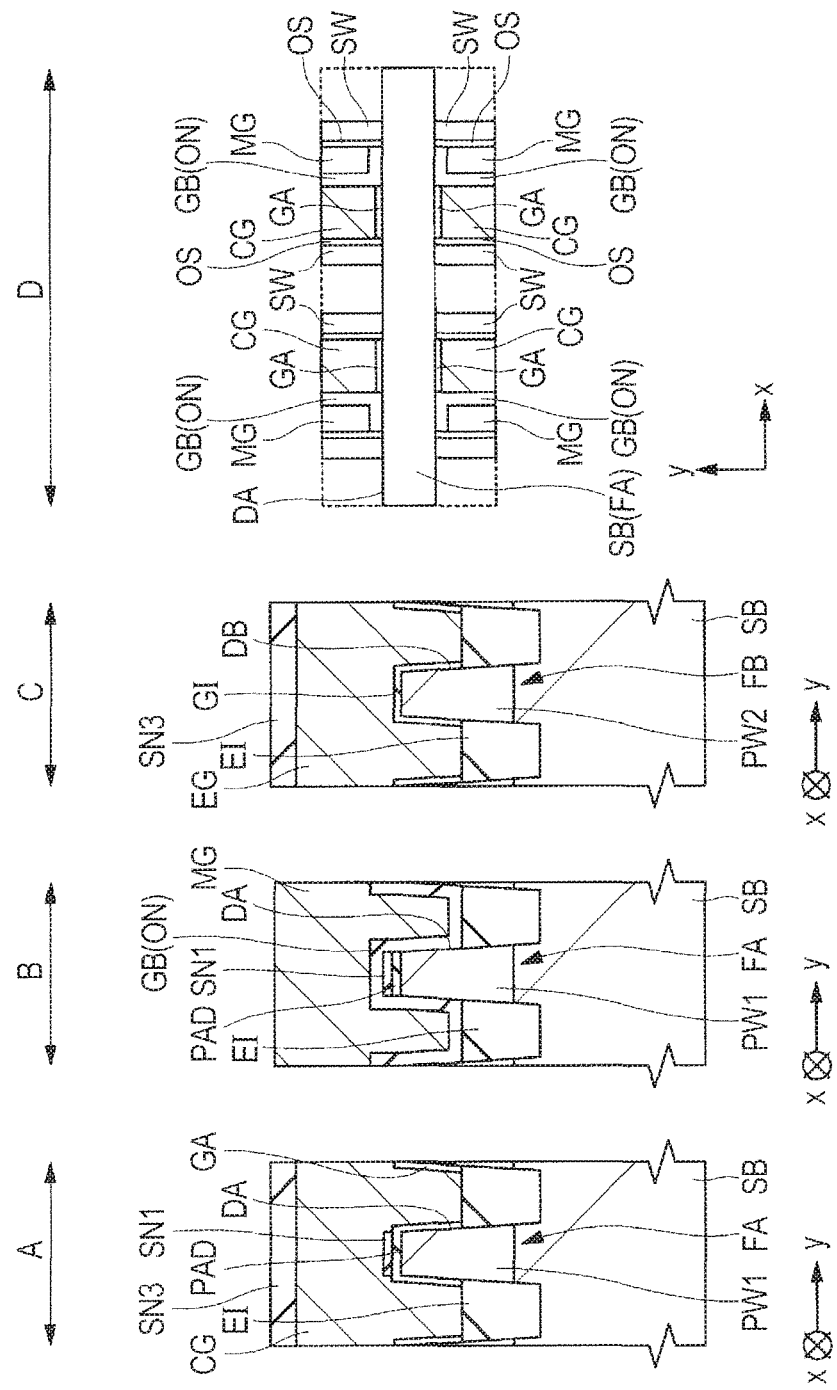
FIG. 33 shows cross-sectional views along line A, line B, and line C in FIG. 32 and a plan view along line D in FIG. 32.

Subsequently, referring to FIGS. 32 and 33, an interlayer insulating film IL is formed on the principal surface of the semiconductor substrate SB. The interlayer insulating film IL is formed by a silicon oxide film, for example. As an underlying layer of the interlayer insulating film IL, a thin insulating film, for example, a silicon nitride film is formed, although not illustrated.

Subsequently, a contact hole CN is formed at a desired portion in the interlayer insulating film IL, and thereafter a contact plug PL is formed inside the contact hole CN. The contact plug PL has a relatively thin barrier film and a relatively thick conductor film formed to be wrapped by the barrier film, for example. The barrier film is formed by a titanium (Ti) film or a titanium nitride (TiN) film, for example, and the conductor film is formed by a tungsten (W) film or an aluminum (Al) film, for example.

Thereafter, a first layer of wiring M1 mainly formed of copper (Cu) or aluminum (Al), for example, is formed on the interlayer insulating film IL, and an upper layer of wiring is further formed, so that a semiconductor device is approximately completed.

<<Features and Advantageous Effects of Semiconductor Device>>

As described before, a main feature of a semiconductor device according to the present embodiment is to configure a control transistor and a memory transistor formed in the memory cell region 1A to have a double-gate structure and to configure a transistor formed in the peripheral circuit region 1B to have a triple-gate structure.

With this feature, it is possible to reduce concentration of an electric field onto a tip portion of the fin FA, especially so that deterioration of reliability of the ONO film ON can be prevented.

Further, in addition to the above-described advantageous effects, another advantageous effect that a variation in operation characteristics of a memory cell can be suppressed can be obtained as described below.

Figure 34A:
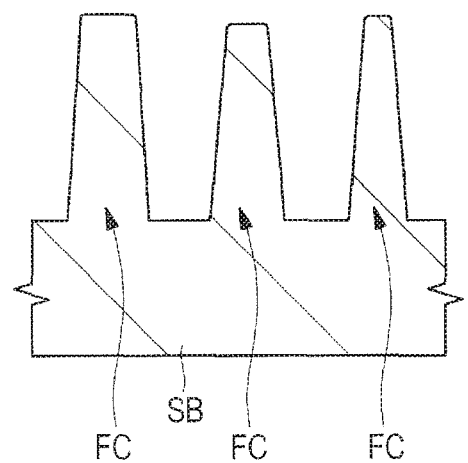
FIG. 34A shows a cross-sectional view illustrating a shape of a fin according to a comparative example.
Figure 34B:
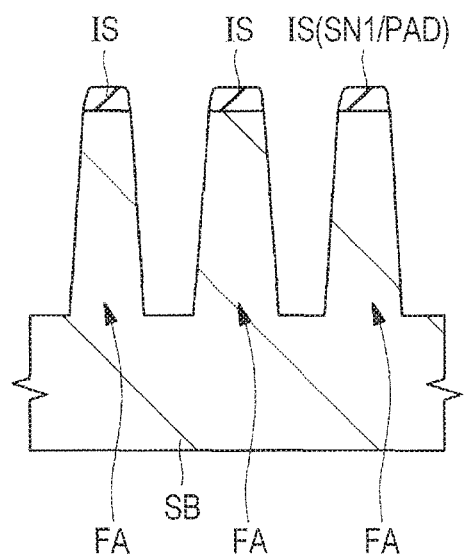
FIG. 34B shows a cross-sectional view illustrating a shape of a fin according to the embodiment.

The other advantageous effect of the semiconductor device according to the present embodiment is described, referring to FIGS. 34A and 34B one of which illustrates a comparative example. FIG. 34A shows a cross-sectional view illustrating a shape of a fin according to the comparative example, and FIG. 34B shows a cross-sectional view illustrating a shape of a fin according to the present embodiment.

As illustrated in FIG. 34A, in a semiconductor device according to the comparative example, an insulating film, for example, the multilayer film of the insulating film SN1/the oxide film PAD formed in the present embodiment, is not formed on a top surface of a fin FC formed in a memory cell region. Therefore, immediately after the fin FC is formed (immediately after the step described referring to FIGS. 16 and 17), the top surface of the fin FC and sidewalls thereof are exposed. Further, immediately after a control gate electrode is formed (immediately after the step described referring to FIGS. 20 and 21), the top surface and the sidewalls of the fin FC that forms a memory gate electrode are exposed.

Therefore, in the steps of cleaning, thermal oxidation, etching that processes a control gate electrode, and the like, the top surface and the sidewalls of the fin FC can be easily affected by a process variation, so that a tip portion of the fin FC can be easily rounded. Further, because of a dimension variation, it is likely that a desired shape cannot be obtained in a plurality of fins FC. Thus, a variation in operation characteristics of a memory cell may occur.

Meanwhile, in the semiconductor device according to the present embodiment, an insulating film IS, for example, the multilayer film of the insulating film SN1/the oxide film PAD, is formed on the top surface of the fin FA formed in the memory cell region, as illustrated in FIG. 34B. Thus, what is affected by the process variation in the steps of cleaning, thermal oxidation, etching that processes a control gate electrode, and the like is the sidewalls of the fin FA only. Therefore, a variation of the shape of the tip portion of the fin FA hardly occurs, and the variation in operation characteristics of the memory cell can be suppressed.

<<Variations>>

In the aforementioned memory cell region, both the control transistor and the memory transistor are configured to have a double-gate structure in which the multilayer film of the insulating film SN1/the oxide film PAD is formed on the top surface of the fin FA in order to reduce concentration of an electric field onto the tip portion of the fin FA. However, the insulating film formed on the top surface of the fin FA is not limited to the multilayer film of the insulating film SN1/the oxide film PAD. Variations of the present embodiment are described below.

1. First Variation

Figure 35:
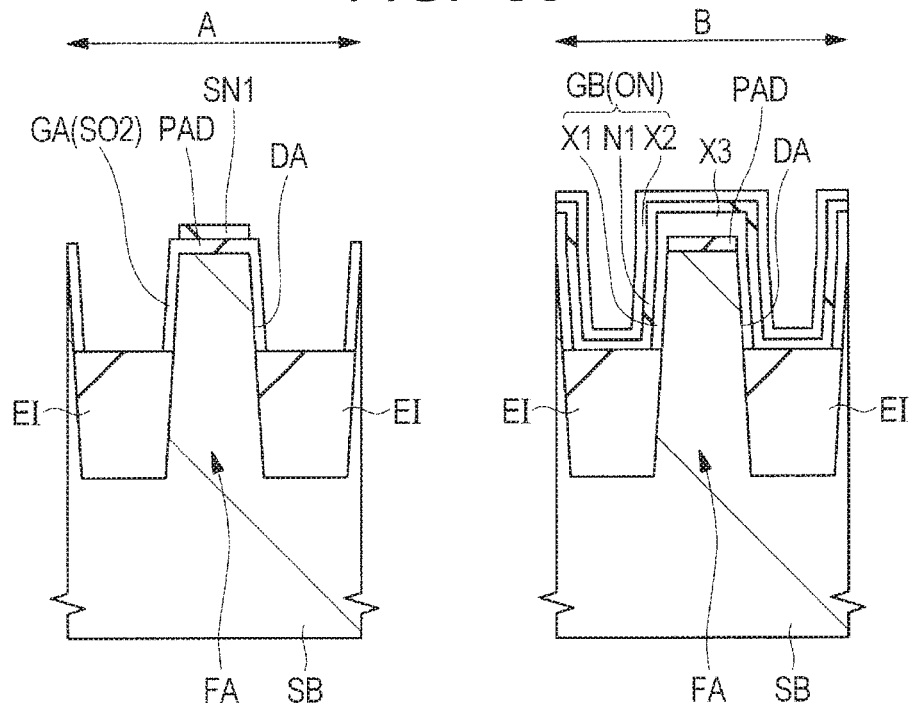
FIG. 35 shows a cross-sectional view illustrating a shape of a fin formed in a memory cell region, according to a first variation of the embodiment.

A first variation of the present embodiment is described referring to FIG. 35. FIG. 35 shows cross-sectional views along line A and line B in FIG. 1 both illustrating a shape of a fin formed in a memory cell region.

In a control transistor, the multilayer film of the insulating film SN1/the oxide film PAD is formed on the top surface of the fin FA, and the oxide film SO2 is formed on the sidewalls of the fin FA, as illustrated in FIG. 35.

Because the thickness of the multilayer film of the insulating film SN1/the oxide film PAD is larger than the thickness of the oxide film SO2, the multilayer film of the insulating film SN1/the oxide film PAD formed on the top surface of the fin FA does not function as the gate insulating film GA of the control transistor. Therefore, the control gate electrode has a double-gate structure that uses the oxide film SO2 formed on the sidewalls on both sides of the fin FA as the gate insulating film GA.

Meanwhile, in a memory transistor, a multilayer film having a four-layer structure in which the oxide film PAD, a silicon oxide film X3, the silicon nitride film N1, and the silicon oxide film X2 are sequentially formed (which may be referred to as the multilayer film of the silicon oxide film X2/the silicon nitride film N1/the silicon oxide film X3/the oxide film PAD) is formed on the top surface of the fin FA, and the ONO film ON having a three-layer structure in which the silicon oxide film X1, the silicon nitride film N1, and the silicon oxide film X2 are sequentially formed is formed on the sidewalls of the fin FA.

Because the thickness of the silicon oxide film X3 is larger than the thickness of the silicon oxide film X2 forming the ONO film ON, the multilayer film formed on the top surface of the fin FA does not function as the gate insulating film GB of the memory transistor. Therefore, a memory gate electrode is configured to have a double-gate structure that uses the ONO film ON formed on the sidewalls on both sides of the fin FA as the gate insulating film GB.

The multilayer film of the silicon oxide film X2/the silicon nitride film N1/the silicon oxide film X3/the oxide film PAD on the top surface of the fin FA forming the memory transistor can be formed by a manufacturing method described below, for example.

Figure 20:
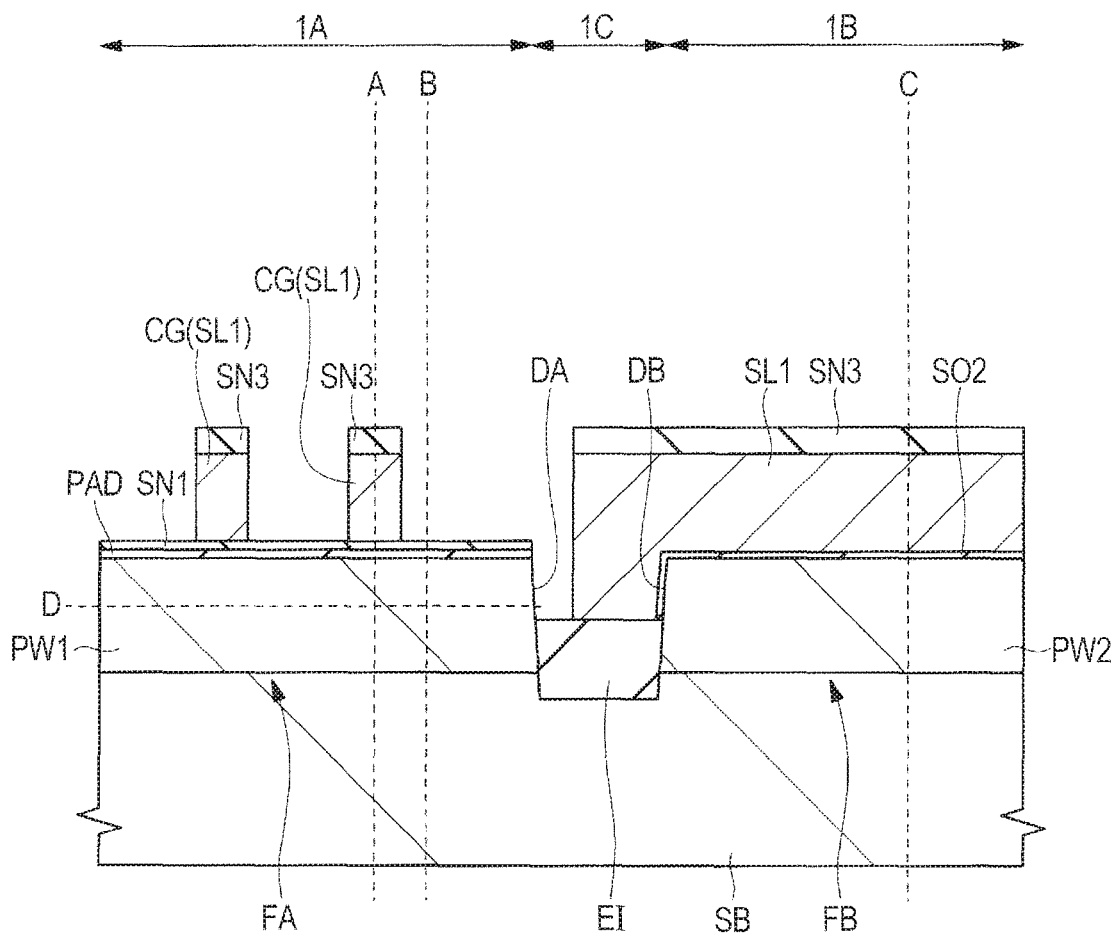
FIG. 20 shows a cross-sectional view explaining a manufacturing step of the semiconductor device, subsequent to FIG. 18.
Figure 21:
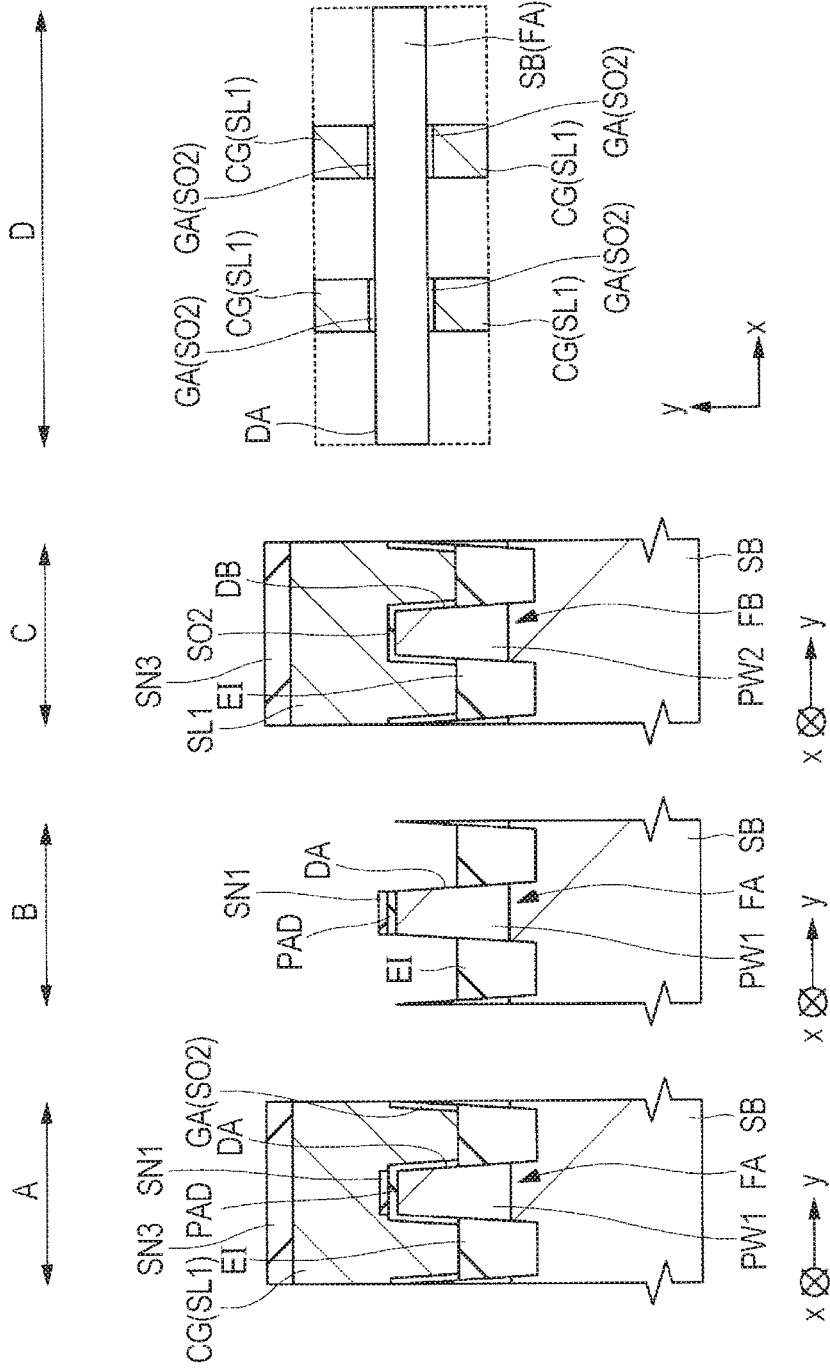
FIG. 21 shows cross-sectional views along line A, line B, and line C in FIG. 20 and a plan view along line D in FIG. 20.

After the steps described referring to FIGS. 20 and 21, the exposed sidewalls of the fin FA are oxidized by thermal oxidation, for example. By this step, the silicon oxide film X1 covering the sidewalls of the fin FA is formed.

At this time, the insulating film SN1 has been already formed on the top surface of the fin FA forming the memory transistor. The thickness of this insulating film SN1 is adjusted in advance, so that it is entirely oxidized by thermal oxidation described above to form the silicon oxide film X3 thicker than the silicon oxide film X1. Thus, the multilayer film in which the oxide film PAD, the silicon oxide film X3 obtained by entirely oxidizing the insulating film SN1, the silicon nitride film N1, and the silicon oxide film X2 are sequentially formed is formed on the top surface of the fin FA forming the memory transistor.

Meanwhile, the ONO film ON in which the silicon oxide film X1, the silicon nitride film N1, and the silicon oxide film X2 are sequentially formed is provided between the memory gate electrode MG and the sidewalls of the fin FA, as described before.

2. Second Variation

Figure 36:
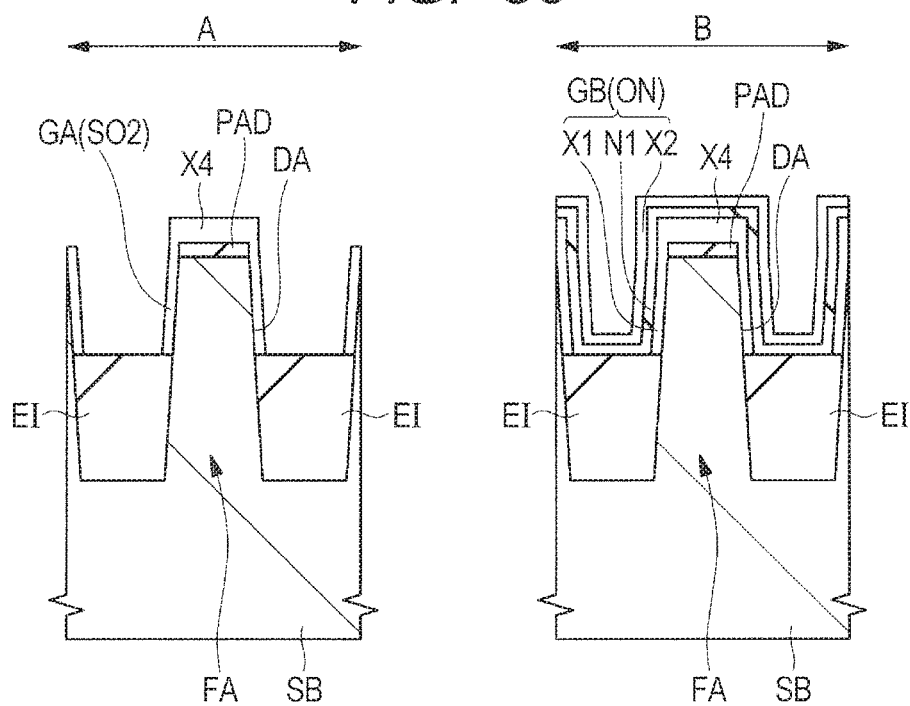
FIG. 36 shows a cross-sectional view illustrating a shape of a fin formed in a memory cell region, according to a second variation of the embodiment.

A second variation of the present embodiment is described referring to FIG. 36. FIG. 36 shows cross-sectional views along line A and line B in FIG. 1 both illustrating a shape of a fin formed in a memory cell region.

In a control transistor, a multilayer film having a two-layer structure formed by the oxide film PAD and a silicon oxide film X4 (which may be referred to as the multilayer film of the silicon oxide film X4/the oxide film PAD) is formed on the top surface of the fin FA, and the oxide film SO2 is formed on the sidewalls of the fin FA, as illustrated in FIG. 36.

Because the thickness of the multilayer film of the silicon oxide film X4/the oxide film PAD is larger than the thickness of the oxide film SO2, the multilayer film of the silicon oxide film X4/the oxide film PAD formed on the top surface of the fin FA does not function as the gate insulating film GA of the control transistor. Therefore, the control gate electrode has a double-gate structure that uses the oxide film SO2 formed on the sidewalls on both sides of the fin FA as the gate insulating film GA.

Meanwhile, in the memory transistor, a multilayer film having a four-layer structure in which the oxide film PAD, the silicon oxide film X4, the silicon nitride film N1, and the silicon oxide film X2 are sequentially formed (which may be referred to as the multilayer film of the silicon oxide film X2/the silicon nitride film N1/the silicon oxide film X4/the oxide film PAD) is provided on the top surface of the fin FA, and the ONO film ON having a three-layer structure in which the silicon oxide film X1, the silicon nitride film N1, and the silicon oxide film X2 are sequentially formed is provided on the sidewalls of the fin FA.

Because the thickness of the silicon oxide film X4 is larger than the thickness of the silicon oxide film X1 forming the ONO film ON, the multilayer film provided on the top surface of the fin FA does not function as the gate insulating film GB of the memory transistor. Therefore, the memory gate electrode has a double-gate structure that uses the ONO film ON formed on the sidewalls on both sides of the fin FA as the gate insulating film GB.

The multilayer film of the silicon oxide film X4/the oxide film PAD on the top surface of the fin FA forming the control transistor and the multilayer film of the silicon oxide film X2/the silicon nitride film N1/the silicon oxide film X4/the oxide film PAD on the fin FA forming the memory transistor can be formed by a manufacturing method described below, for example.

Figure 16:
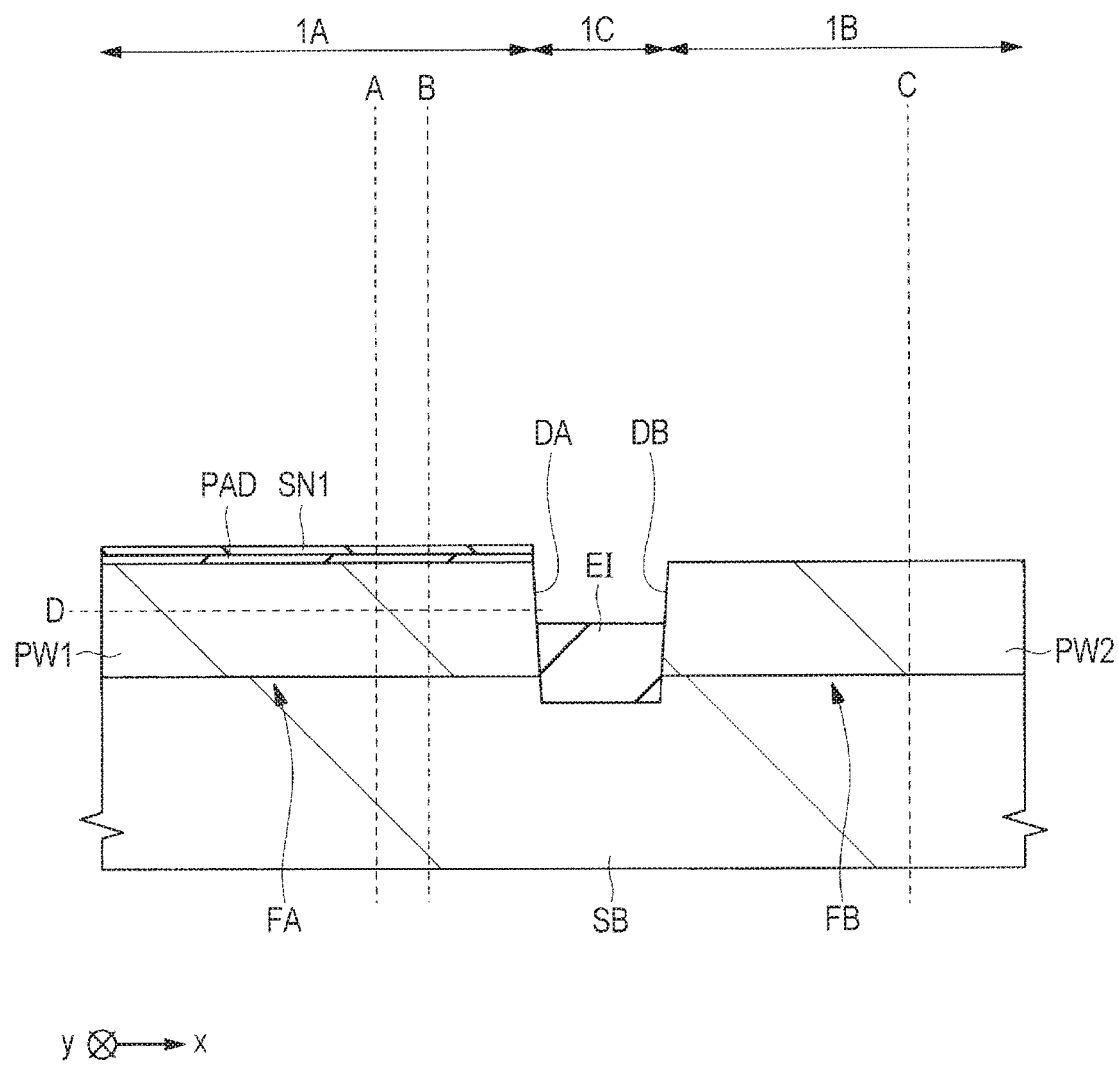
FIG. 16 shows a cross-sectional view explaining a manufacturing step of the semiconductor device, subsequent to FIG. 14.
Figure 17:
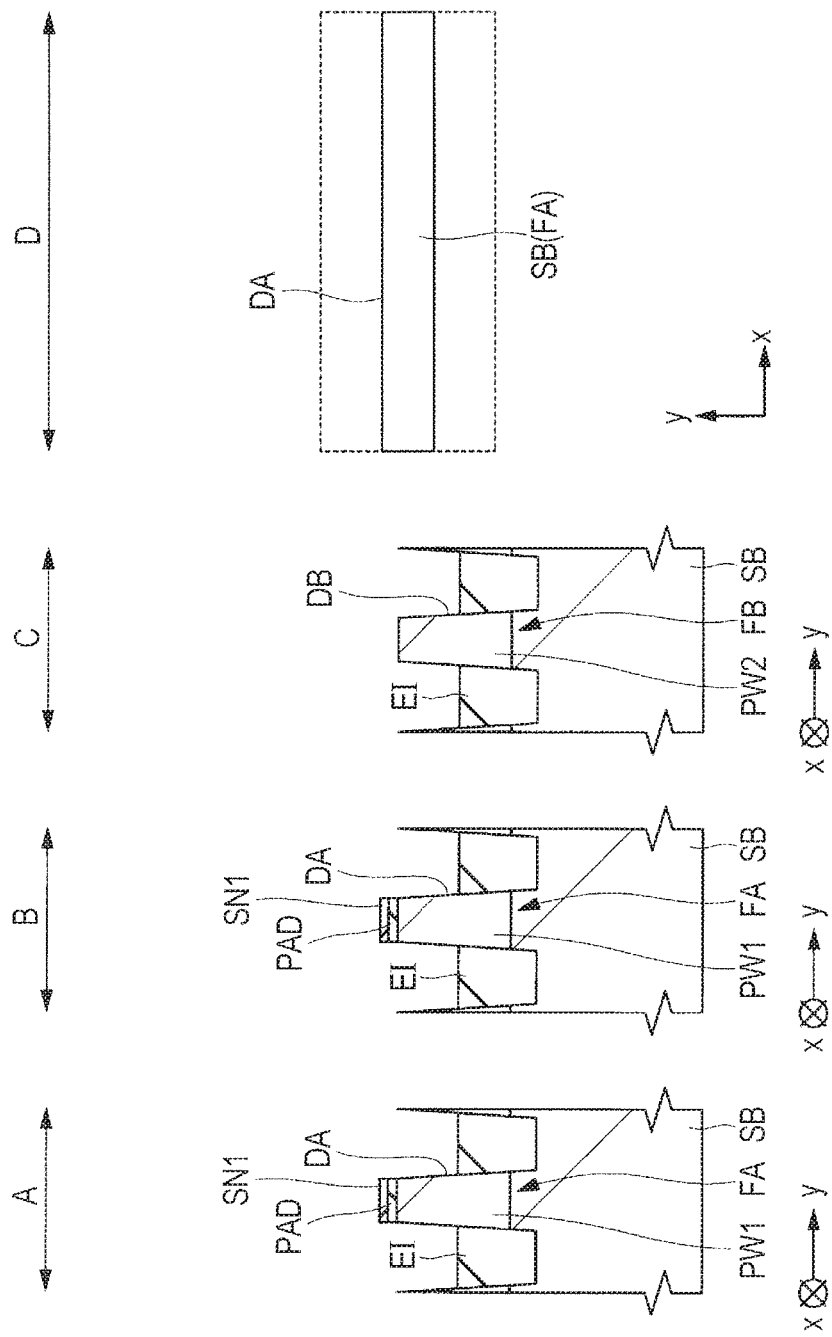
FIG. 17 shows cross-sectional views along line A, line B, and line C in FIG. 16 and a plan view along line D in FIG. 16.

After the steps described referring to FIGS. 16 and 17, the oxide film SO2 is formed on the exposed sidewalls of the fin FA by thermal oxidation, for example.

At this time, the insulating film SN1 has been already formed on the top surface of the fin FA. The thickness of this insulating film SN1 is adjusted in advance, so that it is entirely oxidized by thermal oxidation described above to form the silicon oxide film X4 thicker than the oxide film SO2. By this step, the silicon oxide film X4 is formed on the top surface of the fin FA, and the oxide film SO2 is formed on the sidewalls of the fin FA.

Figure 22:
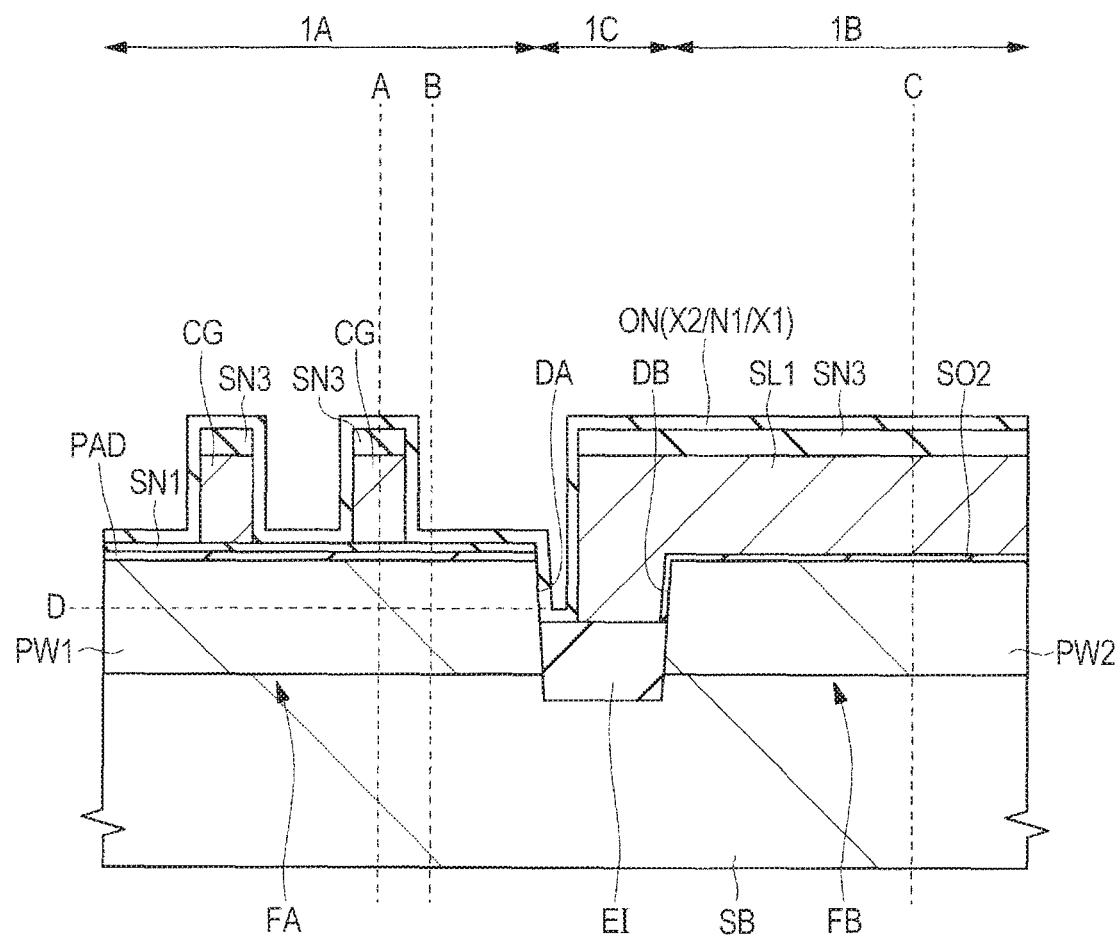
FIG. 22 shows a cross-sectional view explaining a manufacturing step of the semiconductor device, subsequent to FIG. 20.
Figure 23:
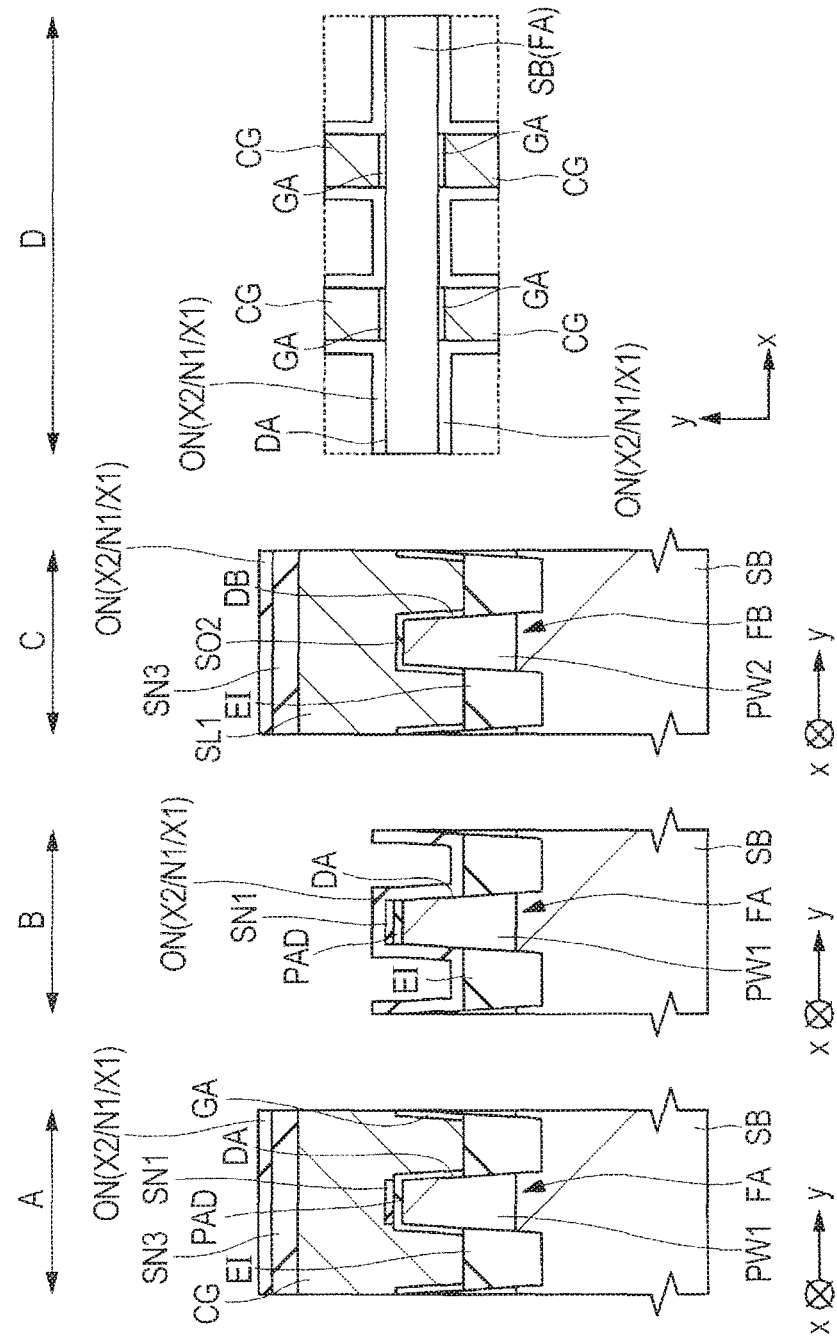
FIG. 23 shows cross-sectional views along line A, line B, and line C in FIG. 22 and a plan view along line D in FIG. 22.

Thereafter, the multilayer film having the three-layer structure in which the silicon oxide film X1, the silicon nitride film N1, and the silicon oxide film X2 are sequentially formed is provided in approximately the same manner as that described referring to FIGS. 22 and 23.

In the above description, the invention made by the inventors of the present application has been specifically described by way of the embodiments. However, the present invention is not limited to the aforementioned embodiments, and can be changed in various ways within the scope not departing from the gist thereof.

What is claimed is:

1. A manufacturing method of a semiconductor device that includes a non-volatile memory cell including a first transistor formed in a first transistor region in a first region over a principal surface of a semiconductor substrate and a second transistor formed in a second transistor region in the first region, adjacent to the first transistor region, and a third transistor formed in a second region of the principal surface of the semiconductor substrate, the method comprising the steps of:
   (a) sequentially forming a first oxide film, a first nitride film, a second oxide film, and a second nitride film over the principal surface of the semiconductor substrate in the first region, and sequentially forming the first oxide film, the first nitride film, and the second nitride film over the principal surface of the semiconductor substrate in the second region;
   (b) processing the first oxide film, the first nitride film, the second oxide film, and the second nitride film in the first region and further processing a portion of atop surface of the semiconductor substrate to form the first projections respectively formed by portions of the semiconductor substrate in the first region, and processing the first oxide film, the first nitride film, and the second nitride film in the second region and further processing a portion of the top surface of the semiconductor substrate to form the second projections respectively formed by portions of the semiconductor substrate in the second region;
   (c) embedding a gap between the first projections adjacent to each other and a gap between the second projections adjacent to each other with a first insulating film;
   (d) removing the second oxide film and the second nitride film in the first region while the first oxide film and the first nitride film are made to remain, and removing the first oxide film, the first nitride film, and the second nitride film in the second region;
   (e) lowering a top surface of the first insulating film to make a sidewall of an upper portion of the first projection and a sidewall of an upper portion of the second projection be exposed;
   (f) performing thermal oxidation for the semiconductor substrate to form a third oxide film over the exposed sidewall of the first projection and to form a fourth oxide film over an exposed top surface of the second projection and the exposed sidewall of the second projection;
   (g) depositing a first conductor film over the principal surface of the semiconductor substrate;
   (h) processing the first conductor film to form a first gate electrode of the first transistor that crosses over the first projection in the first transistor region and is formed by the first conductor film, and to remove the first conductor film and the third oxide film in the second transistor region;
   (i) forming a second insulating film including a charge storage film over the principal surface of the semiconductor substrate;
   (j) depositing a second conductor film over the second insulating film;
   (k) processing the second conductor film to form a second gate electrode of the second transistor that crosses over the first projection in the second transistor region and is formed by the second conductor film, and to remove the second conductor film and the second insulating film in the first transistor region and the second region; and
   (l) processing the first conductor film to form a third gate electrode of the third transistor that crosses over the second projection in the second region and is formed by the first conductor film,
   wherein the third oxide film is formed between a sidewall of the first projection and the first gate electrode in the first transistor region,
   wherein the second insulating film is formed between a sidewall of the first projection and the second gate electrode in the second transistor region, and
   wherein the fourth oxide film is formed between the top surface and the sidewall of the second projection and the third gate electrode in the second transistor region.

2. The manufacturing method of the semiconductor device according to claim 1,
   wherein the step (i) includes the steps of:
   (i1) performing thermal oxidation for the semiconductor substrate to form a fifth oxide film over the sidewall of the first projection and a surface of the first nitride film in the second transistor region;
   (i2) forming the charge storage film over the top surface of the semiconductor substrate; and
   (i3) forming a sixth oxide film over the charge storage film to obtain the second insulating film formed by the fifth oxide film, the charge storage film, and the sixth oxide film,
   wherein the first oxide film and the first nitride film are formed between the top surface of the first projection and the first gate electrode in the first transistor region, and
   wherein the first oxide film, the first nitride film, and the second insulating film are formed between the top surface of the first projection and the second gate electrode in the second transistor region.

3. The manufacturing method of the semiconductor device according to claim 1, wherein the step (i) includes the steps of:

(i4) performing thermal oxidation for the semiconductor substrate to form a seventh oxide film over the sidewall of the first projection in the second transistor region, and entirely oxidizing the first nitride film to form an eighth oxide film;

(i5) forming the charge storage film over the top surface of the semiconductor substrate; and (i6) forming a ninth oxide film over the charge storage film to obtain the second insulating film formed by the seventh oxide film, the charge storage film, and the ninth oxide film, wherein the first oxide film and the first nitride film are formed between the top surface of the first projection and the first gate electrode in the first transistor region, and wherein the first oxide film, the eighth oxide film, the charge storage film, and the ninth oxide film are formed between the top surface of the first projection and the second gate electrode in the second transistor region.

4. The manufacturing method of the semiconductor device according to claim 1, wherein in the step (f), thermal oxidation is performed for the semiconductor substrate to form the third oxide film over the exposed sidewall of the first projection and to form the fourth oxide film over the exposed top surface and the exposed sidewall of the second projection, and the first nitride film is entirely oxidized to form a tenth oxide film.

5. The manufacturing method of the semiconductor device according to claim 4, wherein the step (i) includes the steps of:

(i7) performing thermal oxidation for the semiconductor substrate to form an eleventh oxide film over the sidewall of the first projection in the second transistor region;

(i8) forming the charge storage film over the top surface of the semiconductor substrate; and (i9) forming a twelfth oxide film over the charge storage film to obtain the second insulating film formed by the eleventh oxide film, the charge storage film, and the twelfth oxide film, wherein the first oxide film and the tenth oxide film are formed between the top surface of the first projection and the first gate electrode in the first transistor region, and wherein the first oxide film, the tenth oxide film, the charge storage film, and the twelfth oxide film are formed between the top surface of the first projection and the second gate electrode in the second transistor region.

6. The manufacturing method of the semiconductor device according to claim 1, wherein the third oxide film formed between the sidewall of the first projection and the first gate electrode in the first transistor region functions as a gate insulating film of the first transistor, wherein the second insulating film formed between the sidewall of the first projection and the second gate electrode in the second transistor region functions as a gate insulating film of the second transistor, and wherein the fourth oxide film formed between the top surface and the sidewall of the second projection and the third gate electrode in the second region functions as a gate insulating film of the third transistor.

* * * * *